United States Patent
Ohya

(10) Patent No.: US 6,389,373 B1
(45) Date of Patent: May 14, 2002

(54) RESOLVER SIGNAL PROCESSING SYSTEM

(75) Inventor: Hideshi Ohya, Toyota (JP)

(73) Assignee: Toyota Jidosha Kabushiki Kaisha, Toyota (JP)

(*) Notice: Subject to any disclaimer, the term of this patent is extended or adjusted under 35 U.S.C. 154(b) by 0 days.

(21) Appl. No.: 09/350,677

(22) Filed: Jul. 12, 1999

(30) Foreign Application Priority Data

Aug. 5, 1998 (JP) ............................................ 10-222063

(51) Int. Cl.[7] ............................ G06F 15/00; H03F 1/26; H04F 15/00
(52) U.S. Cl. ........................................ 702/189; 347/116
(58) Field of Search .............................. 702/189, 183, 702/163; 318/605, 651; 341/116, 132, 117; 324/207.23

(56) References Cited

U.S. PATENT DOCUMENTS

| | | | | |
|---|---|---|---|---|
| 5,134,404 A | * | 7/1992 | Peterson | 341/116 |
| 5,260,650 A | * | 11/1993 | Schwesig et al. | 324/163 |
| 5,463,393 A | * | 10/1995 | Havlicsek | 341/115 |
| 5,637,998 A | * | 6/1997 | Kushihara | 324/207.25 |
| 5,684,719 A | * | 11/1997 | Anagnost | 702/153 |
| 5,710,509 A | * | 1/1998 | Got et al. | 324/207.25 |
| 5,739,659 A | * | 4/1998 | Ezuka | 318/605 |
| 5,783,925 A | * | 7/1998 | Umemura et al. | 318/661 |
| 5,796,231 A | * | 8/1998 | Kyodo | 318/608 |
| 5,861,831 A | * | 1/1999 | Murden et al. | 341/139 |
| 5,868,296 A | * | 2/1999 | Gentile et al. | 226/35 |
| 5,949,359 A | * | 9/1999 | Vlahu | 341/116 |
| 6,084,376 A | * | 7/2000 | Piedl et al. | 318/605 |
| 6,211,633 B1 | * | 4/2001 | Jones et al. | 318/254 |

FOREIGN PATENT DOCUMENTS

JP 10-111145 4/1998

* cited by examiner

Primary Examiner—Marc S. Hoff
Assistant Examiner—Demetrius R. Pretlow
(74) Attorney, Agent, or Firm—Oliff & Berridge, PLC

(57) ABSTRACT

The disclosed system generates resolver reference signal on the basis of the clock of CPU 202. The CPU 202 generates resolver output signal sampling and servo control loop trigger signals in synchronization with its own clock. Thus, the synchronization between the reference signal and the sampling is assured. Because the sampling is constantly performed at a fixed phase point of the reference signal, the sampling accuracy is improved, while stable servo control loop response is obtained because the sampling is also synchronous with servo control loop so that the sampling will not interrupt the servo control loop.

20 Claims, 21 Drawing Sheets

(a)

(b)

RESOLVER SIGNAL PROCESSING SYSTEM

BACKGROUND OF THE INVENTION

1. Field of the Invention

The present invention relates to a resolver signal processing system that executes processing such as, for example, to measure the angle of rotation of a rotator, based on the resolver output signals.

2. Description of the Related Art

Resolvers are known that detect an angle of rotation of a rotator's rotor. The measured results are typically used for servo control of the rotator.

FIG. 1 shows a functional block diagram that schematizes a predecessor servo control system using the resolver, implemented by prior art. The resolver 2 outputs signals produced by modulating the amplitude of reference signal supplied from a sine-wave oscillator 4, dependent on the angle of rotor rotation. The resolver 2 and a motor 6 are configured to share a same shaft on which they both rotate, so that the angle of rotation of the rotor of the motor 6 can be detected based on the resolver output signals.

The measurement of an angle of rotation is conventionally performed using a circuit commonly called a-resolver/digital (R/D) converter. To the primary winding of the resolver, a reference signal, sine wave E1·sin ωt (E1 represents the amplitude of the reference signal) is input. The outputs are $V_{sin}$ and $V_{cos}$ voltages that are produced at the ends of two secondary windings positioned apart from each other by 90 degrees of phase difference. The $V_{sin}$ and $V_{cos}$ resolver output signals are respectively equal to modulated signals E2·sin (ωt+α) sin θ and E2·sin (ωt+α) cos θ which are produced by modulating the reference signal, depending on the angle of rotor rotation θ. (E2 is the amplitude of the modulated signals, α is the phase shift of the modulated signals from the reference signal, and E2/E1 is the ratio of transformer for the modulated signals to the reference signal.) After amplified by differential amplifiers 8 and 10 respectively, these signals are input to an R/D converter 12 and an analog-digital (A/D) converter 14. The R/D converter 12 carries out a Phase Locked Loop (PLL) control process in the following manner: The R/D converter 12 calculates a value of sin (θ−φ) from sin φ and cos φ signals relative to the reference angle of rotation φ, which are, for example, controlled by a voltage control oscillator, and the $V_{sin}$ and $V_{cos}$ resolver output signals including the angle of rotor rotation θ; and increments or decrements a value of count corresponding to φ so that the phase difference (θ−φ) will be 0. Thus, the R/D converter 12 detects and outputs a value of φ as the value of the angle of rotor rotation θ when the PLL control is convergent, that is (θ−φ)=0.

A central processing unit (CPU) 16, operating according to the clock, to which the angle of rotation θ and other data are input from the R/D converter 12 and the result of conversion and associated data are input from the A/D converter 14, executes the processing for servo control of the motor 6 and fault detection for the resolver 2. For example, the CPU 16 generates PWM pulses to drive the motor 6, based on the clock. Current values of $I_U$ and $I_V$ corresponding to two phases of a three-phase signal for driving the motor 6 are converted into digital values through the A/D converter 14 and fed back to a control loop processing section 22 of the CPU. Using the result of feedback, the control loop processing section 22 executes servo control loop processing to set the voltages in the U, V, and W phases which are output as PWM voltage requirements.

For fault detection, for example, at a point where the amplitude of the $V_{sin}$ and $V_{cos}$ resolver output signals reaches the maximum, the CPU 16 calculates the square sum of these signals ($V_{sin}^2+V_{cos}^2$) The phase difference between the peak amplitude point of the $V_{sin}$ and $V_{cos}$ resolver output signals and the peak amplitude point of the reference signal is constant. An interrupt signal generator section for resolver amplitude check 24 detects the timing of the peak amplitude of the resolver output signals, based on the result of detection of the peak amplitude of the reference signal output from the sine-wave oscillator 4. When a faulty timing is detected, the interrupt signal generator section 24 issues a signal for interrupting the servo control loop executed by the control loop processing section 22 within the CPU 16, causing the CPU 16 to halt the servo control loop and execute the processing for fault detection.

FIG. 2 shows a flowchart for outlining the conventionally applied servo control processing. When the servo control processing starts, the A/D converter is activated (step S50) to execute the A/D conversion of, for example, $I_U$ and $I_V$. The control loop processing section 22 obtains the resolver data which has been output from the R/D converter 12 (step S55) and computes an electrical angle $θ_e$ (step S60), while receiving the A/D converted $I_U$ and $I_V$ data (step S65). In order to facilitate the control of the motor, coordinate transformation is performed. Thus, the $I_U$ and $I_V$ data are transformed into magnetized current Id and torque current Iq, respectively (step S70). The control loop processing section 22 Computes a d-axis voltage requirement and a q-axis voltage requirement, based on the values of Id and Iq (steps 375 and S80). The voltage requirements for d and q axes thus calculated are transformed into three phase coordinates of U, V, and W phases (step S85) Based on the result of this transformation, PWM voltage requirements are generated (step 90). According to the PWM voltage requirements, a triangular wave comparator section 26 generates PWM pulses to drive a driver 28, and the correspondingly generated $I_U$, $I_V$, and $I_W$ currents are supplied to the motor 6.

FIG. 3 shows a flowchart outlining example conventionally applied resolver fault/normal judgment processing. The interrupt signal generator section for resolver amplitude check 24 consists of a comparator that holds a preset threshold for the reference signal peak level and generates an interrupt signal at a timing when the reference signal value exceeds the threshold. In synchronization of this interrupt signal, the fault/normal judgment processing is activated. The A/D converter 14 is then activated (step S100) and the $V_{sin}$ and $V_{cos}$ resolver output signals are acquired by the control loop processing section 22 (step S105) . The acquired signals nearly correspond to the peak point of the reference signal (sin ωt=±1) and their values are ±E2·sin θ and ±E2·cos θ, respectively. Hence, principally, the square sum ($V_{sin}^2+V_{cos}^2$) must become E2. The square sumof these signals is calculated (stepS110) According to whether the resultant square sum exceeds the threshold which has typically been set near E2, the fault/normal judgment is carried out. If the judgment indicates a fault, fault corrective action is executed (S120).

In the conventional implementation of such system, the resolver output signals are sampled for fault/normal judgment, based on the reference signal generated by the sine-wave oscillator 4, whereas the servo control processing for the motor is carried out in synchronization with the output from the CPU's time base section 20 and this output is based on the clock. In this way, the fault/normal judgment and the servo control are based on different signals which are supplied independently; i.e., the output from the sine-wave oscillator 4 and the clock. Consequently, the resolver output signal sampling timing is asynchronous with the servo control cycle and an interrupt for this sampling may occur during the control loop. Unless the resolver output signal sampling is carried out on a real-time basis in synchronization with the peak point of the reference signal, the accuracy of fault detection decreases. For this reason, the computation for servo control loop must pause whenever the interrupt for resolver output signal sampling occurs. This is a drawback, as the output of the voltage requirements is delayed, causing variation in the response ability of the motor control.

Because interruption of the CPU 16 processes is software controlled, the time from the interrupt occurring until the CPU has been instructed to sample the resolver output signals depends on the software response time, which in turn varies with the specific software employed. In some cases, this time may be too short or long and consequently sampling may occur off the maximum amplitude point of the resolver output signals. This is also a problem, inducing the risk of decreasing the accuracy of fault detection. Another problem inducing the same risk is also posed when the phase in which the amplitude of signals from the resolver 2 reaches the peak is shifted due to its temperature characteristics.

Predecessor resolver signal processing systems require the R/D converter to detect an angle of rotation. Because this R/D converter is relatively expensive and its circuit size is large, there is also a drawback that these systems are expensive and relatively large.

In order to obtain the resolver positional data in synchronization with the serve control cycle, some arrangement is required so that the outputs from the R/D converter will be read at certain intervals. To accomplish this, an additional circuit is required for the R/D converter to interface with a bus of the CPU 16. This creates further problems with increased cost and size of the system.

SUMMARY OF THE INVENTION

The object of the present invention is to provide a lower cost resolver signal processing system with simple structure and capable of executing highly-accurate fault detection and servo control, thereby addressing the drawbacks and problems described above.

A resolver signal processing system offered by the invention comprises reference signal generating means for generating reference signal that cycles in a given period on the basis of a clock; sampling trigger signal generating means to generate a sampling trigger signal, which cycles in a given period on the basis of the period of said reference signal, in synchronization with the clock; detection means to sample the output signals from the resolver in response to the sampling trigger signal and detect sine and cosine modulated signals in accordance with the angle of rotation from the resolver output signals; and angle of rotation determining means to determine the angle of rotation, based on the sine and cosine modulated signals.

This invention allows both reference signal and sampling trigger signal to be generated based on the same clock. The generation timing relation between both signals, once set, is maintained afterward; that is, the synchronization of reference signal with sampling trigger signal is assured. Owing to the fact that resolver output signals are produced by modulating the amplitude of the reference signal and the above synchronization between the two signals is maintained, once the sampling of these signals has been set to take place at signal amplitude peak point, these signals are always sampled at that point and basically without being affected by clock variation. Thus, the detection of sine and cosine modulated signals is carried out with accuracy and the angle of rotation is determined by using these modulated signals.

A resolver signal processing system offered by the invention also comprises rotator control trigger signal generating means for generating a rotator control trigger signal in synchronization with the above sampling trigger signal, based on the clock; and rotator control means to start the control of the rotator in response to the rotator control trigger signal.

One of the features of this invention is that the processing for controlling the rotator is synchronous with the resolver output signal sampling, based on the same clock. The sampling can be set to take place at a predetermined timing relative to the rotator control processing. For example, arrangement can be made so that the rotator control processing always starts after the completion of the sampling. This prevents the rotator control processing from pausing whenever the interrupt for sampling occurs.

The sampling trigger signal generating means of the resolver signal processing system will generate sampling trigger signals at timings that discretely correspond to two peaks of the reference signal amplitude, positive and negative during one cycle period of the reference signal.

In addition to the improved accuracy of determining the angle of rotation at sampling points, owing to the fact that the sampling timings are set synchronous with resolver output signals as described above, sampling is performed two times during one period of the reference signal. This feature of the invention improves the resolution of the angle of rotation by shortening the sampling cycle for measuring the angle of rotation.

The sampling trigger signal generating means of the resolver signal processing system will also continuously generate a plurality of sampling trigger signals over a given peak seeking period; detect the peak points of the reference signal, based on the values of the resolver output signals sampled in response to the continuously generated sampling trigger signals; and determine the timings of generating the sampling trigger signals after the peak seeking period, based on the reference signal peak points thus detected as above.

Fundamentally, the sampling of resolver output signals is aimed at their amplitude peaks and the signals are thus sampled near either positive or negative peaks, or near both peaks. The system offered by the invention temporarily samples resolver output signals in a short cyclic period to detect their peak points. The peak points are points at which the absolute amplitude of the sampled signals becomes maximum. Once the peak points have been detected, subsequent sampling is performed at timings corresponding to these points. The resolver output signal and the reference signal are synchronous with each other, but the peak points of both signals do not always match. There is a possibility of one peak point of one signal being shifted from the corresponding peak point of the other signal by a certain segment of phase. If this shift distance is unknown, sampling according to the invention can be executed in a burst manner to determine the shift distance. For example, the burst sampling may be performed in the initial stage of system start.

Furthermore, the sampling trigger signal generating means of the resolver signal processing system generates a pair of sampling trigger signals such that the second one takes place after a fixed interval from the first one occurring; detects a point of peak amplitude of the reference signal relative to the timings of the above pair of sampling trigger signals, based on the values of the resolver output signals sampled in response to the pair of sampling trigger signals; and determines the timings of generating the next, pair of sampling trigger signals, based on the relative peak point of the reference signal thus detected as above.

In another aspect of this invention, a pair of resolver output signals are sampled such that the second one takes place after a fixed interval from the first one. Based on the comparison between the values of the two sampled signals, the resolver output signal amplitude peak is deduced to take place before, between, or after the timings of sampling these signals. The result of this deduction is fed back to the process of determining the next sampling timings. As an example, let us consider the case where a pair of resolver output signals is sampled at certain timings with regard to the positive peak at which the resolver output signal amplitude becomes maximum. If the value of the preceding one is smaller than the succeeding one, the peak is deduced to take place between and after the timings of sampling the two signals. Then, the timings for sampling the next pair are delayed by the required number of clocks. As a result, if the values of newly sampled pair become almost the same, the sampling timing shift is stopped with the estimated peak being between the sampling timings. If the value of the preceding one is still smaller than the succeeding one, the timings for further sampling are shifted more in the same direction. Inversely, if the value of the preceding one is larger than the succeeding one, the sampling timings are shifted in the reverse direction. By executing this operation at certain intervals or all times, the system achieves the minute adjustment of sampling timings so that sampling will occur, matching the peak point.

The angle of rotation determining means of the resolver signal processing system comprises a table of angles of rotation for associating angles of rotation with possible sets of a value of sine function and a value of cosine function; and angle of rotation reading means to obtain a unique angle of rotation from this table, based on the value derived from the sine and cosine modulated signals.

In the following, the relationship between sine and cosine functions and their arguments of angle of rotation are discussed. There are two angles of rotation, giving a value of sine function. Similarly, there are two angles of rotation, giving avalue of cosine function. Thus, only a single value of sine function or cosine function cannot determine a unique angle of rotation. A set of a sine function value and a cosine function value must, however, correspond to one angle of rotation. This invention provides a table of angles of rotation that associates angles of rotation with possible sets of values of sine function and of cosine function. This table can be defined as a two-dimensional table in which a value of angle is specified by a set of a sine function parameter and a cosine function parameter.

In another aspect of the present invention, the above-mentioned angle of rotation determining means comprises a table of angles of rotation for associating angles of rotation with possible values of tangent function; and angle of rotation reading means to obtain a unique angle of rotation from this table, based on the value derived from the sine and cosine modulated signals.

A tangent function with an argument of angle of rotation can have the same value twice for one full rotation because it changes by a period of π. This invention ensures that the determination of a quadrant in which the angle of rotation is positioned is made, based on the plus or minus sign of the obtained values of sine and cosine functions. The invention also provides a one-dimensional table of angles of rotation that holds possible values of tangent function associated with angles of rotation. By using a tangent function as a parameter, an angle within one rotation can be fixed. A value of tangent function is obtained, based on the values of sine and cosine functions. According to the obtained value of tangent function within a quadrant determined as described above, the table is searched and a unique angle of rotation is determined. One method of obtaining a value of tangent function from the values of sine and cosine functions is a division algorithm, but not limited to it. The use of a value of cotangent function instead of a value of tangent function does not conflict with the nature of the invention.

The resolver signal processing system includes fault detection means for detecting a fault in the resolver, based on the comparison between the square sum of the sine and cosine modulated signals and the amplitude of these modulated signals.

Mathematically, the square sum of a value of sine function and a value of cosine function corresponding to any given angle of rotation is 1. The system according to the invention can sample resolver output signals at their peak amplitude with stable accuracy by making the sampling timings synchronous with the resolver output signal peaks as described above. Thus, the above square sum derived from the sampled signals remains constant with accuracy during normal operation of the resolver. As a result, precise fault detection is accomplished, based on the variation from the constant value of square sum.

DESCRIPTION OF THE PREFERRED EMBODIMENTS

Preferred embodiments of the present invention will be described below with reference to the drawings.
[Embodiment 1]

Figure 1:
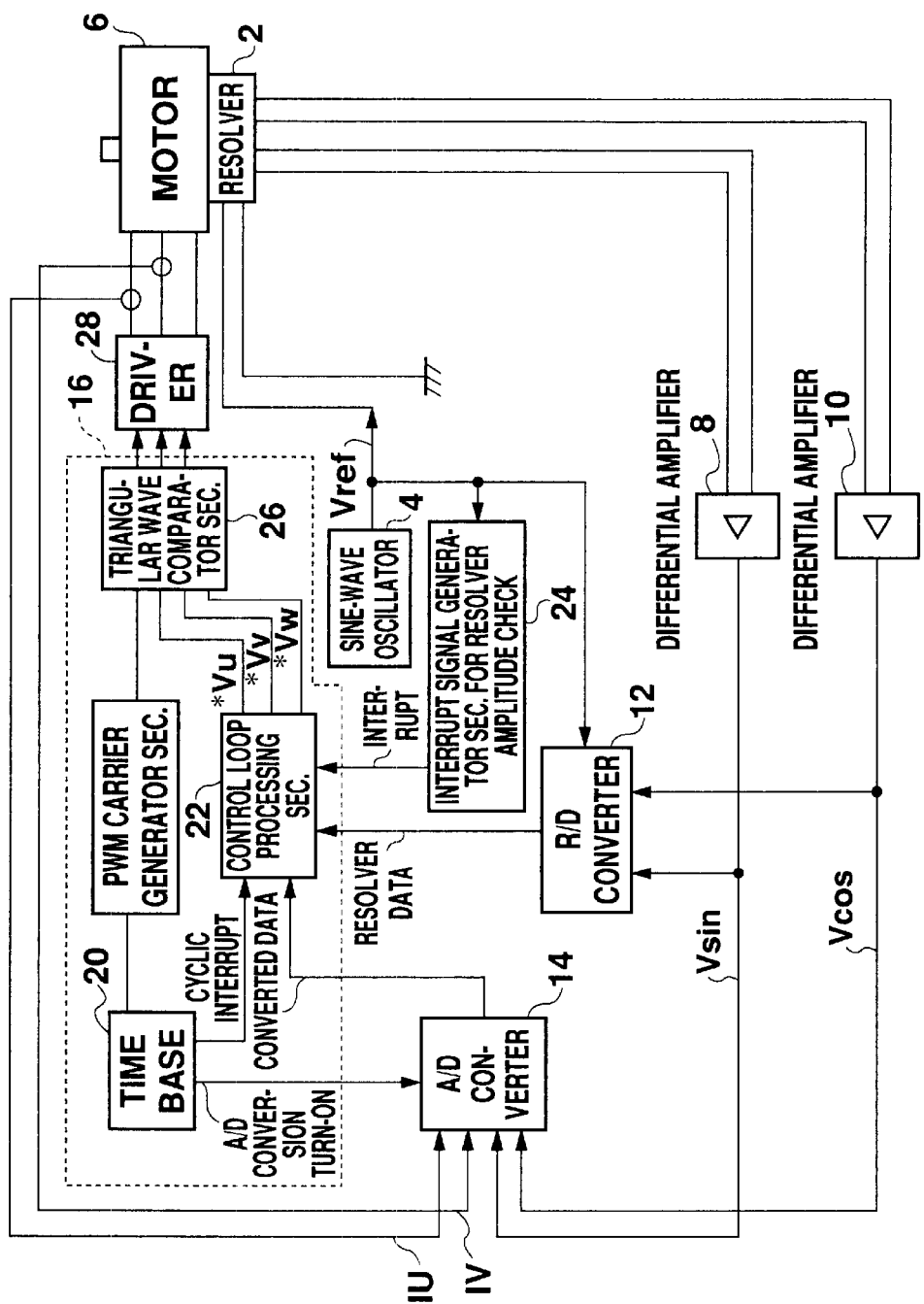
FIG. 1 is a functional block diagram that schematizes a previously known servo control system using a resolver.
Figure 2:
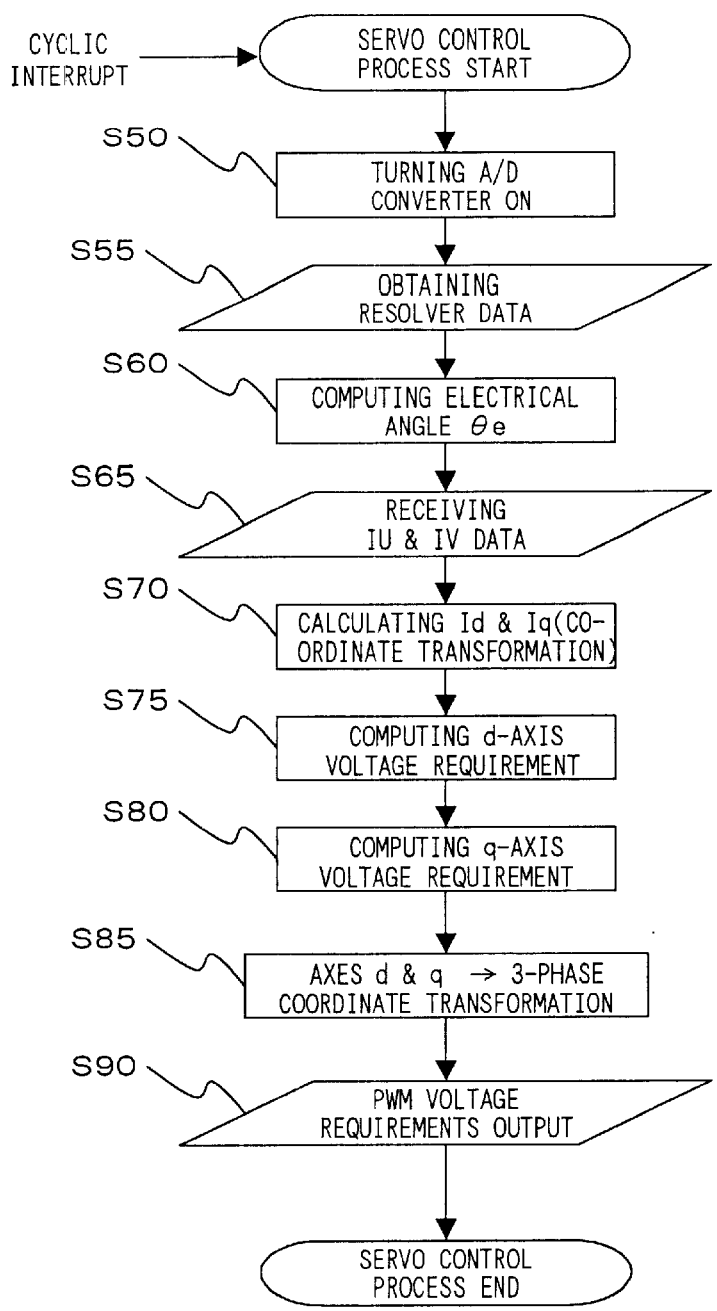
FIG. 2 is a flowchart outlining the conventionally applied servo control processing.
Figure 3:
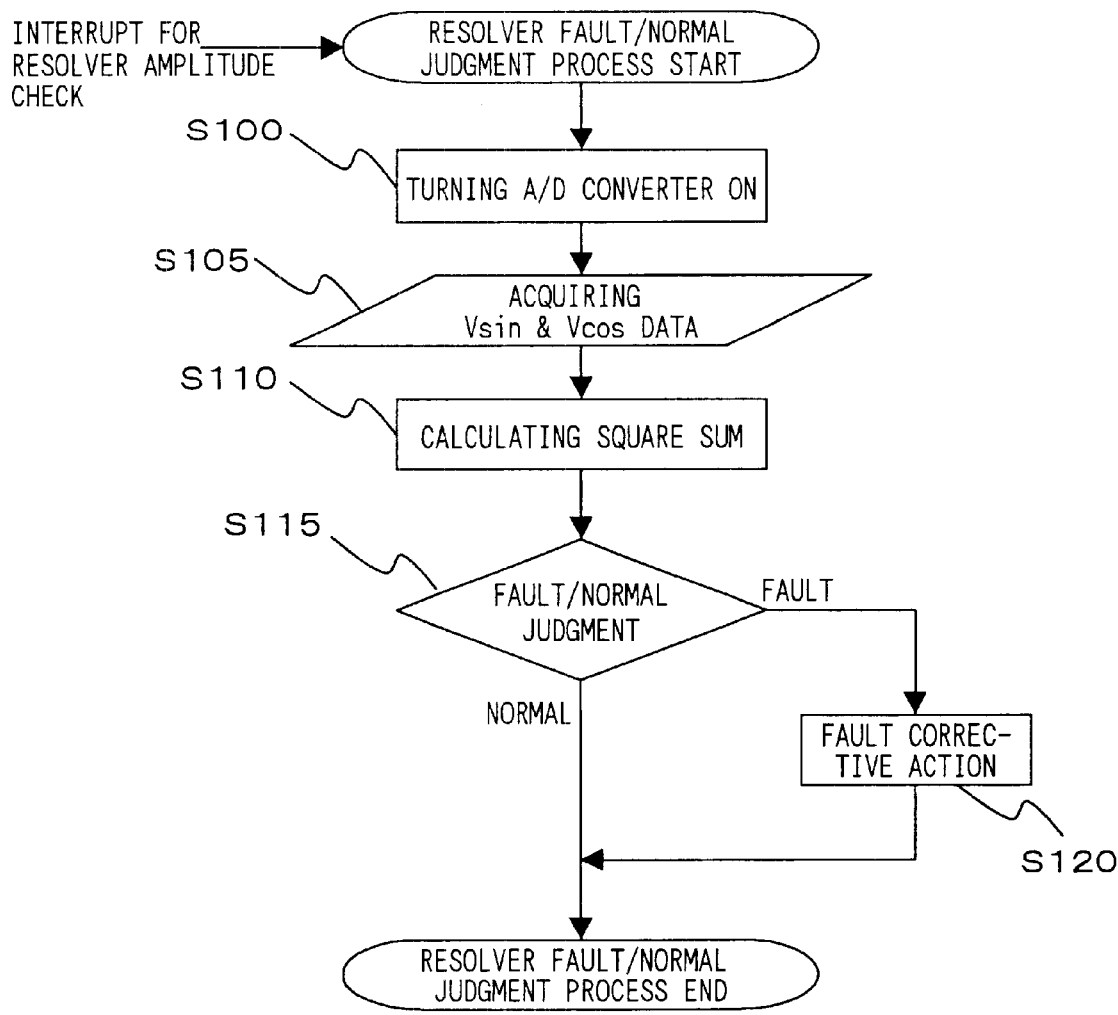
FIG. 3 is a flowchart outlining an example of the conventionally applied resolver fault/normal judgment processing.
Figure 4:
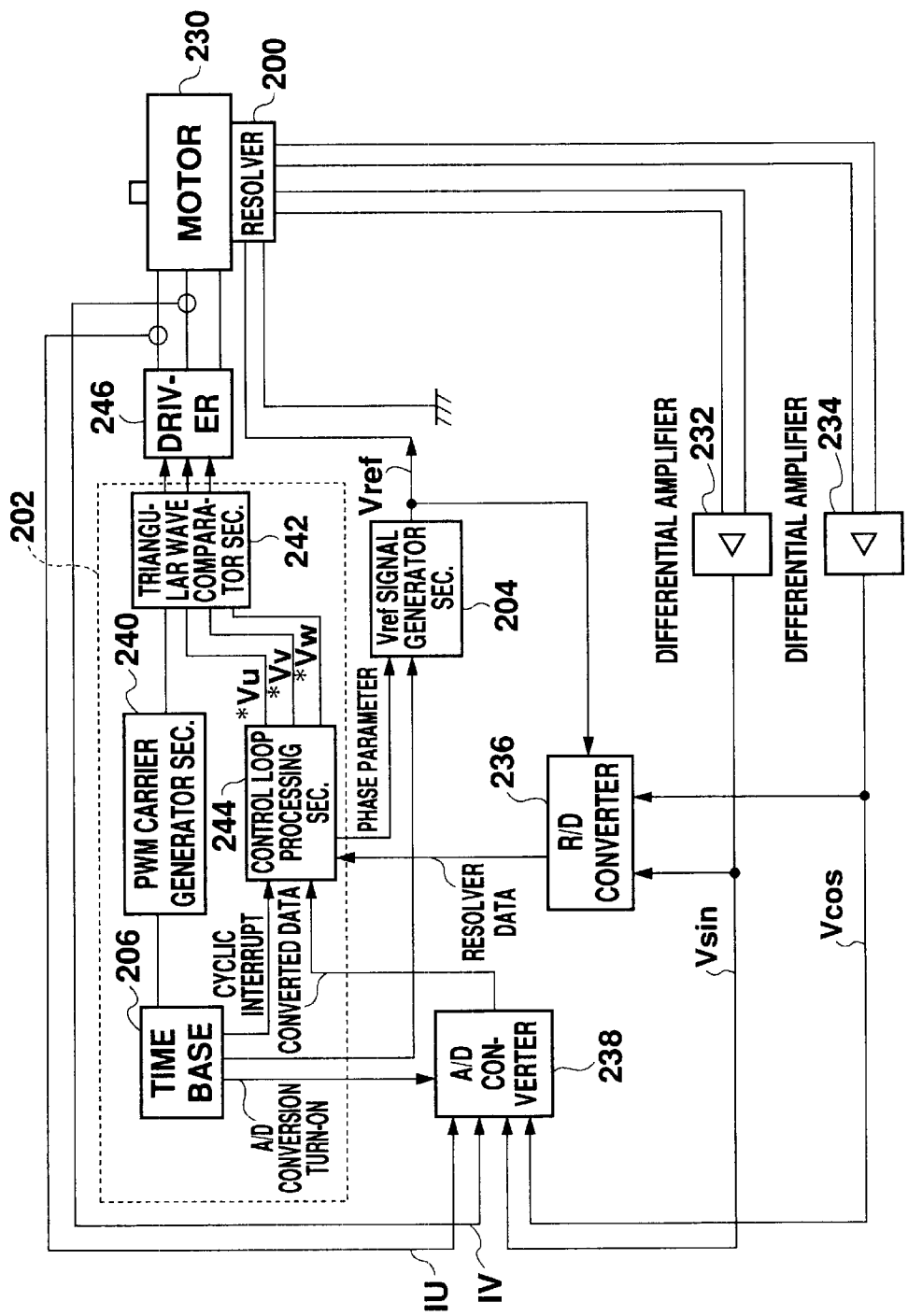
FIG. 4 is a functional block diagram for a servo control system using a resolver, according to a preferred embodiment 1 of the present invention.

FIG. 4 is a functional block diagram of a servo control system using a resolver, according to the present invention. This system structure eliminates the necessity of the sine-wave oscillator used in similar systems.

In the system of Embodiment 1, reference signal $V_{ref}$ is generated by a $V_{ref}$ signal generator section 204. A time base section 206 of CPU 202 generates clock and other signals for various applications, based on the clock of the CPU 202. The $V_{ref}$ signal generator section 204 generates sine-wave reference signals, based on the clock pulses supplied from the time base section 206.

Figure 5:
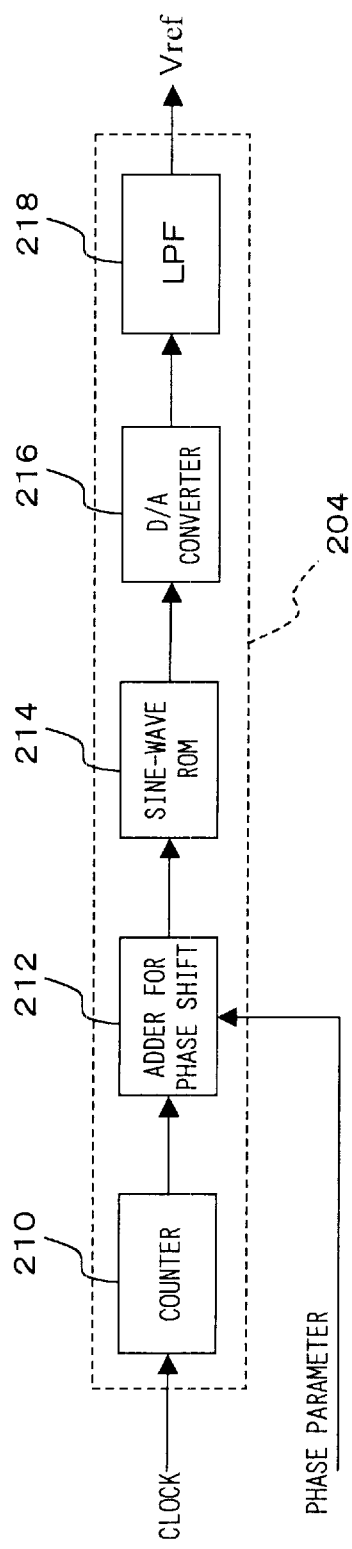
FIG. 5 is a structural block diagram of one example of the $V_{ref}$ signal generator section according to the present invention.

FIG. 5 is a structural block diagram of one example type of the $V_{ref}$ signal generator section 204. The $V_{ref}$ signal generator section 204 counts every clock pulse input from the time base section 206, using a counter 210, up to the predefined upper limit of the counter 210. The value of the counter 210 is supplied through an adder for phase shift 212 to a sine-wave ROM 214 in which it is used as an address. The sine-wave ROM 214 stores the values corresponding to the sine-wave pulses sampled at certain time intervals at sequential addresses. When given a value of the counter 210 as an address, the sine-wave ROM 214 reads the value stored at the address and outputs it to a D/A converter 216. The waveform values of sine-wave pulses thus sequentially read from the sine-wave ROM 214 in response to the clock pulses from the time base section 206 are then converted into an analog waveform by the D/A converter 216. Because this analog waveform still has discrete inherited digital components, a low-pass filter 218 (or a band-pass filter) shapes it smooth and a reference signal $V_{ref}$ shaped in a sine-wave form is generated. In this implementation for reference signal generation, the period of a reference signal is set by the upper limit $N_{max}$ of the counter 210. The adder for phase shift 212 can shift the phase of a reference signal. For example, the adder for phase shift 212 adds a phase parameter output from a control loop processing section 244 to the value output from the counter 210 and divides the resultant sum by ($N_{max}$+1), then outputs the remainder to the sine-wave ROM 214 as an address.

Figure 6:
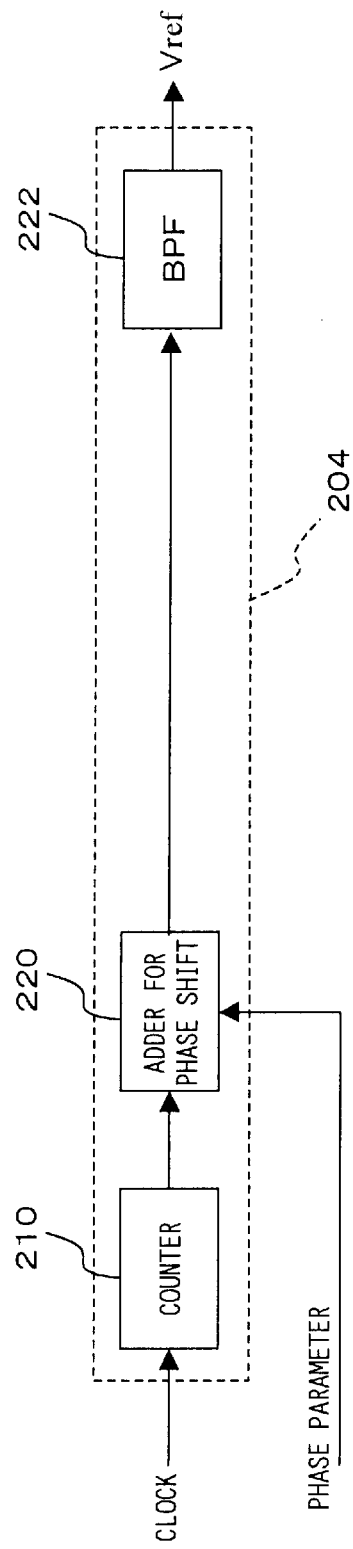
FIG. 6 is a structural block diagram of another example of the $V_{ref}$ signal generator section according to the present invention.

FIG. 6 is another structural block diagram for schematizing another example type of the $V_{ref}$ signal generator section 204. The $V_{ref}$ signal generator section 204 similarly counts every clock pulse input from the time base section 206, using a counter 210, up to the predefined upper limit of the counter 210. To the value of the counter 210, an adder for phase shift 220 adds a value corresponding to a phase parameter. If the resultant sum exceeds a threshold of $N_{max}$, for example, the adder for phase shift 220 inverts its output pulse wave's power level and resets the count. In this way, rectangular waves are continuously output from the adder for phase shift 220 with their power level alternately switching between H (High) and L (Low) each time the predefined number of clock pulses has been reached. A band-pass filter 222 smoothes each rectangular wave passing through it and a reference signal shaped in a sine-wave form is generated.

Each of these two types of $V_{ref}$ signal generator sections 204 has both merits and demerits. The type shown in FIG. 5 is more complex than the type shown in FIG. 6 in the circuit structure, but has a merit of generating a less distorted sine-wave form with less fluctuating amplitude. On the other hand, the sine-wave form generated by the type shown in FIG. 6 experiences greater fluctuation in its amplitude because of the fluctuation or variation of a filter constant and is generally more distorted than the type shown in FIG. 5. However, the merit of the type shown in FIG. 6 is simple circuit structure.

The system presented in Embodiment 1 thus generates reference signals, based on the clock used for the operation of the CPU 202, and supplies them to a resolver 200. The reference signals are synchronous with the clock and consequently the period of a reference signal is maintained at a predetermined time which is an integer multiple of the clock cycle time. The resolver output signals which have been amplitude-modulated from the reference signals, dependent on angle of rotation θ of a motor 230, are also synchronous with the clock.

Output voltages $V_{sin}$ and $V_{cos}$ that are produced at the ends of two secondary windings positioned apart from each other by 90 degrees of phase difference are respectively amplified by differential amplifiers 232 and 234 and then input to an R/D converter 236 and an A/D converter 238. As for corresponding previous converters, the R/D converter 236 detects and outputs a value corresponding to the angle of rotor rotation θ.

The CPU 202 operating on the clock, to which angle of rotation θ and other data are input from the R/D converter 236 and the result of conversion and associated data are input from the A/D converter 238, executes the processing for servo control of the motor 230 and fault detection for the resolver 200. For example, a PWM carrier generator section 240 incorporated into the CPU 202 for this particular purpose generates PWM carriers in a triangular waveform, based on the output from the time base section 206 in synchronization with the clock. A triangular wave comparator section 242 compares the voltage of a PWM carrier with PWM voltage requirements (*$V_U$), (*$V_V$), and (*$V_W$) for the U, V, and W phases, generated by the control loop processing section 244. For instance, if the carrier voltage is higher than the voltage requirement for one phase, a PWM pulse with the carrier signal power level being H during that phase and L during other phases is produced from the comparator section 242. The PWM pulse is supplied to a driver 246 and, for example, used for switching of a transistor, which is a component of the driver. As a result, the driver 246 generates motor drive currents $I_U$, $I_V$, and $I_W$ corresponding to the U, V, and W phases and supplies these currents to the motor 230.

Currents $I_U$ and $I_V$ corresponding to two phases of the three phase signal for driving the motor 230 are fed back to the control processing section 244, after converted into digital values by the A/D converter 238. The processing by the control loop processing section 244 is activated by a cyclic interrupt signal produced from the time base section 206. The time base section 206 also generates a signal for triggering the A/D converter 238 to execute the A/D conversion of the above currents $I_U$ and $I_V$. The loop process for servo control of the motor 230 is thus controlled by the time base section 206 so as to be in synchronization with the clock.

The $V_{sin}$ and $V_{cos}$ resolver output signals, after output from the differential amplifiers 232 and 234, are sampled by the A/D converter 238 at their peak amplitude. The timings of this sampling are also controlled by the time base section 206 so as to be in synchronization with the clock. Because the reference signals used for the system are synchronous with the clock as described above, the resolver output signals, which are produced by modulating the amplitude of the reference signals, are intrinsically synchronous with the clock. Once the timings of sampling the $V_{sin}$ and $V_{cos}$ resolver output signals have been set at peak amplitude point, thus stable peak signal sampling is performed constantly. The thus sampled resolver output signal values are, for example, used for resolver fault/normal judgment, base on the square sum of the two signals $(V_{sin}^2 + V_{cos}^2)$, as described for the similar prior art system.

Figure 7:
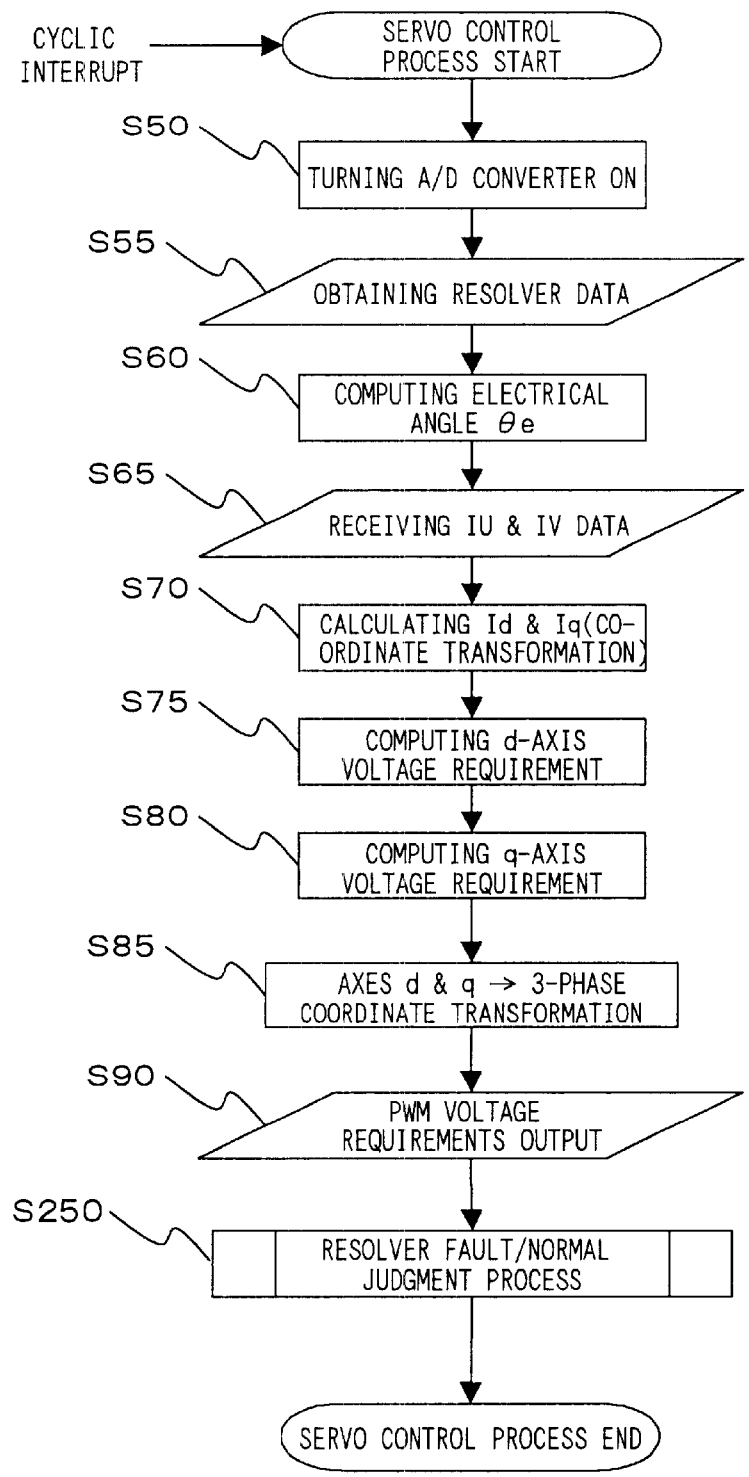
FIG. 7 is a flowchart outlining the servo control processing performed by the system of Embodiment 1.

FIG. 7 is a flowchart outlining the servo control processing performed by the system of Embodiment 1. When the servo control processing starts with a cyclic interrupt signal which is synchronous with the clock, the steps regarding motor control S50 to S90 are carried out sequentially as described for the prior art system. As a feature of the processing performed by the offered system, the process flow is defined such that the resolver fault/normal judgment processing S250 is preset to be executed after the main servo control process. This point differs from the prior art system in which the resolver fault/normal judgment processing is activated by interrupting the servo control processing as occasion arises after the signal peak detection. For the system of the present system, the servo control processing activation timing and the resolver fault/normal judgment processing activation timing are respectively fixed in synchronization with the same clock. Specifically, these timings are preset such that the servo control processing always starts in advance by the time allowed to complete its one loop prior to the resolver output signal peak reappearing and the start of the resolver fault/normal judgment processing follows the completion of one loop of servo control.

In previous systems, these two timings are determined based on independent separate signal sources, and the relation between the timings may vary. Consequently, the timings cannot be preset and the resolver fault/normal judgment processing must be activated by interrupting the servo control processing, according to the result of peak detection. In the present invention, on the other hand, such interruption is not necessary. Because the servo control processing is not interrupted in the present system, there is no undesirable delay of the control response. Such interruption for initiating the resolver fault/normal judgment processing must be processed by software and there is a possibility of variation in the interrupt processing time, according to the used software. For the reason, the prior art system did not always assure the exact synchronization between the resolver fault/normal judgment following the interrupt processing and the resolver output signal peak point. This problem is eliminated by the offered system that is capable of sampling the resolver output signals at peak amplitude with accuracy, thus achieving more precise fault/normal judgment.

Figure 8:
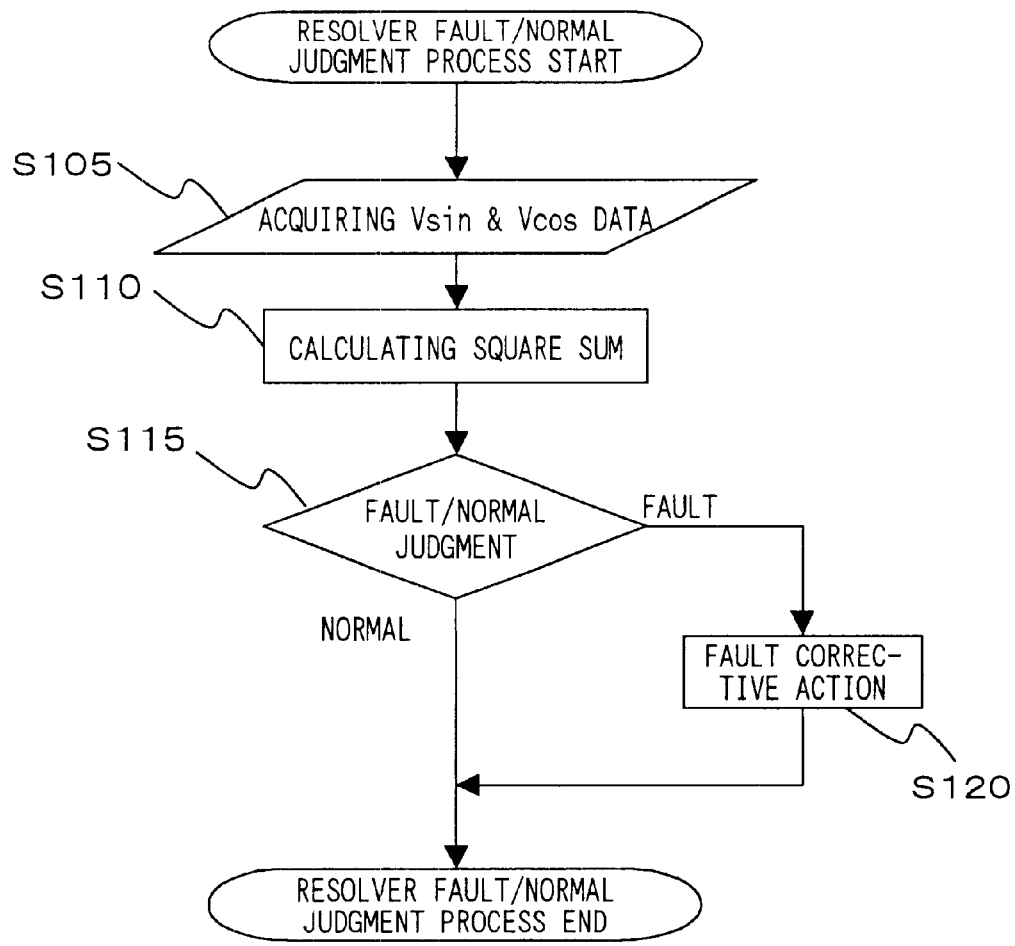
FIG. 8 is a flowchart for outlining the resolver fault/normal judgment processing performed by the system of Embodiment 1.

In this connection, FIG. 8 shows a flowchart outlining the resolver fault/normal judgment processing S250 in which steps S105 to S120 are executed, basically the same as the corresponding process carried out by known systems.

With regard to FIG. 7 where the resolver fault/normal judgment processing S250 is placed after the servo control processing steps S55 to S90, an alternative process flow in which the step S250 precedes the step S55 can be defined.

By constructing the system with the above components and operating it to generate the reference signal based on the clock, as described above, the present invention provides the following advantages: (1) simple structure, eliminating the sine-wave oscillator; (2) the resolver output signal amplitude check can always be performed, synchronized with the reference signal peak amplitude point, which improves the accuracy of the amplitude check used for fault/normal judgment; and (3) the amplitude check can be performed at a constant timing relative to the timing of servo control processing execution, assuring that delay or time variation of the servo control response is prevented.

[Embodiment 2]

Figure 9:
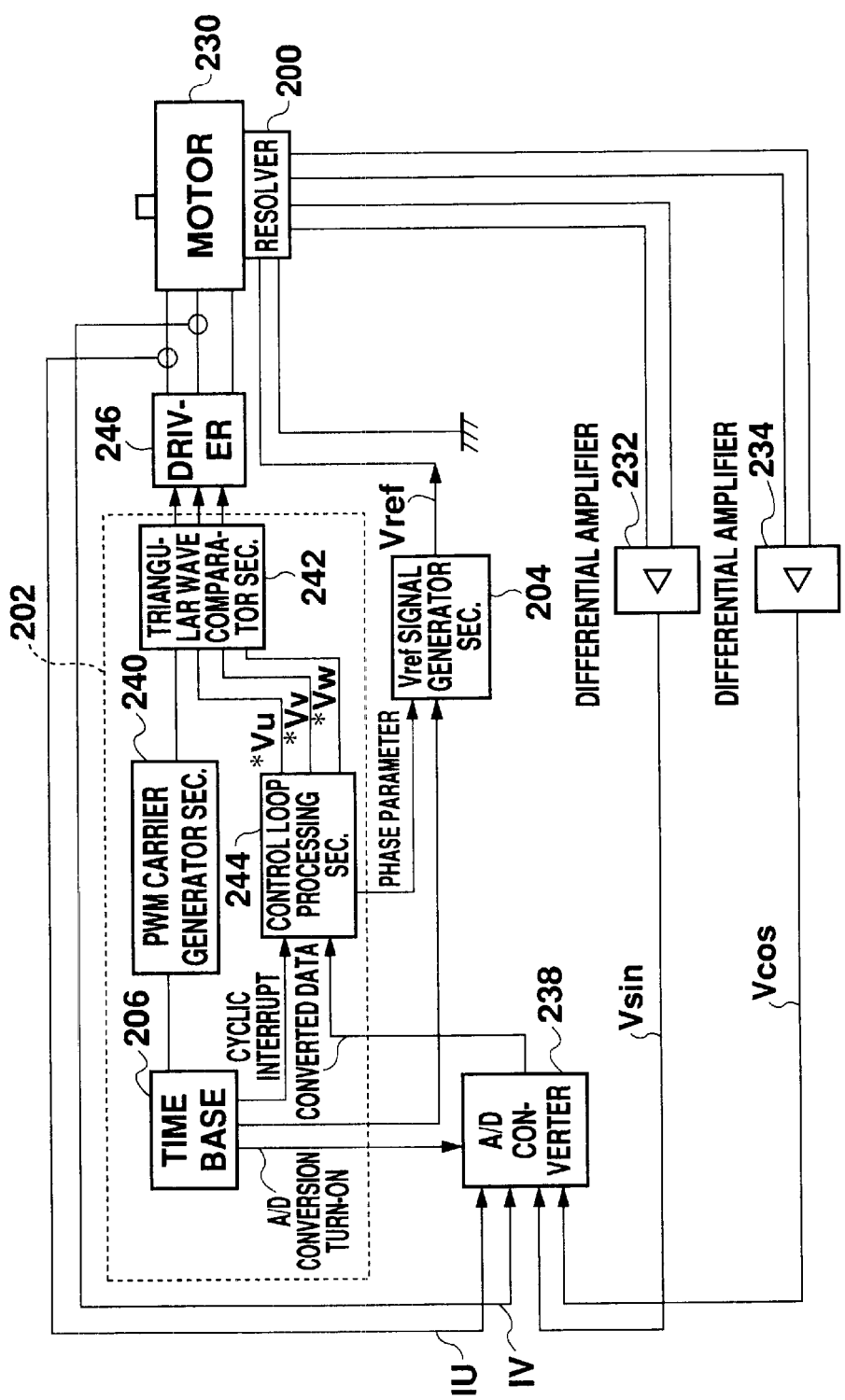
FIG. 9 is a functional block diagram that schematizes a servo control system using a resolver, offered by the invention in a preferred Embodiment 2.

FIG. 9 is a functional block diagram that schematizes a servo control system using a resolver as explained in the description of Embodiment 2. This system structure eliminates the R/D converter in addition to the sine-wave oscillator, although these components have been used in the prior art system for the same application. In the reference figures regarding Embodiment 2 and subsequent embodiments, components and processing steps corresponding to those described in the above Embodiment 1 are assigned the same reference numbers and their explanation is not repeated.

As in Embodiment 1, the A/D converter 238 of the of Embodiment 2 can sample the $V_{sin}$ and $V_{cos}$ resolver output signals at their peak amplitude points with accuracy. As a result, sine and cosine modulated signals sin θ and cos θ are detected with accuracy. The CPU 202 obtains a value of θ by computation based on the values of sin θ and cos θ. Because of the synchronization between the reference signal and the clock, the accuracy of sin θ and cos θ is increased and thus a value of θ can be obtained through computation. For the reason, it is not necessary to install the R/D converter for detecting a value of θ in the offered system. Eliminating the R/D converter is a benefit, of course, because a smaller system can be developed with lower cost. Besides, there is no need of the circuit for interfacing the R/D converter with the CPU 202. Consequently, the more CPU resources can be allocated to other applications, such as a serial port; data bus, and pulse counter, and the processing efficiency is enhanced.

Figure 10:
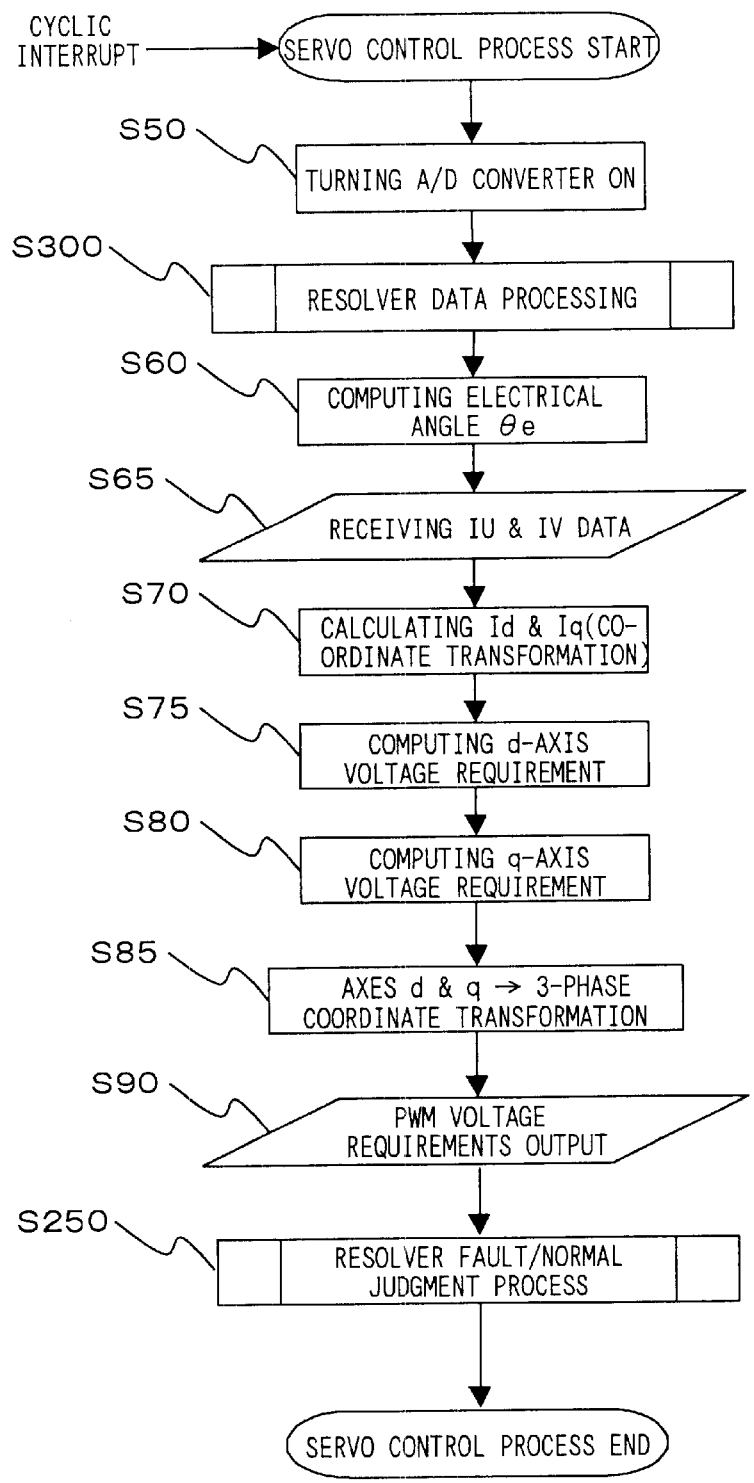
FIG. 10 is a flowchart for outlining the servo control processing performed by the system of Embodiment 2.

FIG. 10 is a flowchart outlining the servo control processing performed in Embodiment 2. When the servo control processing starts, triggered by a cyclic interrupt signal which is synchronous with the clock, the A/D converter 238 is activated in the step S50. Then, the system of Embodiment 2 executes resolver data processing S300 instead of the step S55 in the case of Embodiment 1. Subsequent steps S55 to 90 and S350 are the same as in the case of Embodiment 1.

Figure 11:
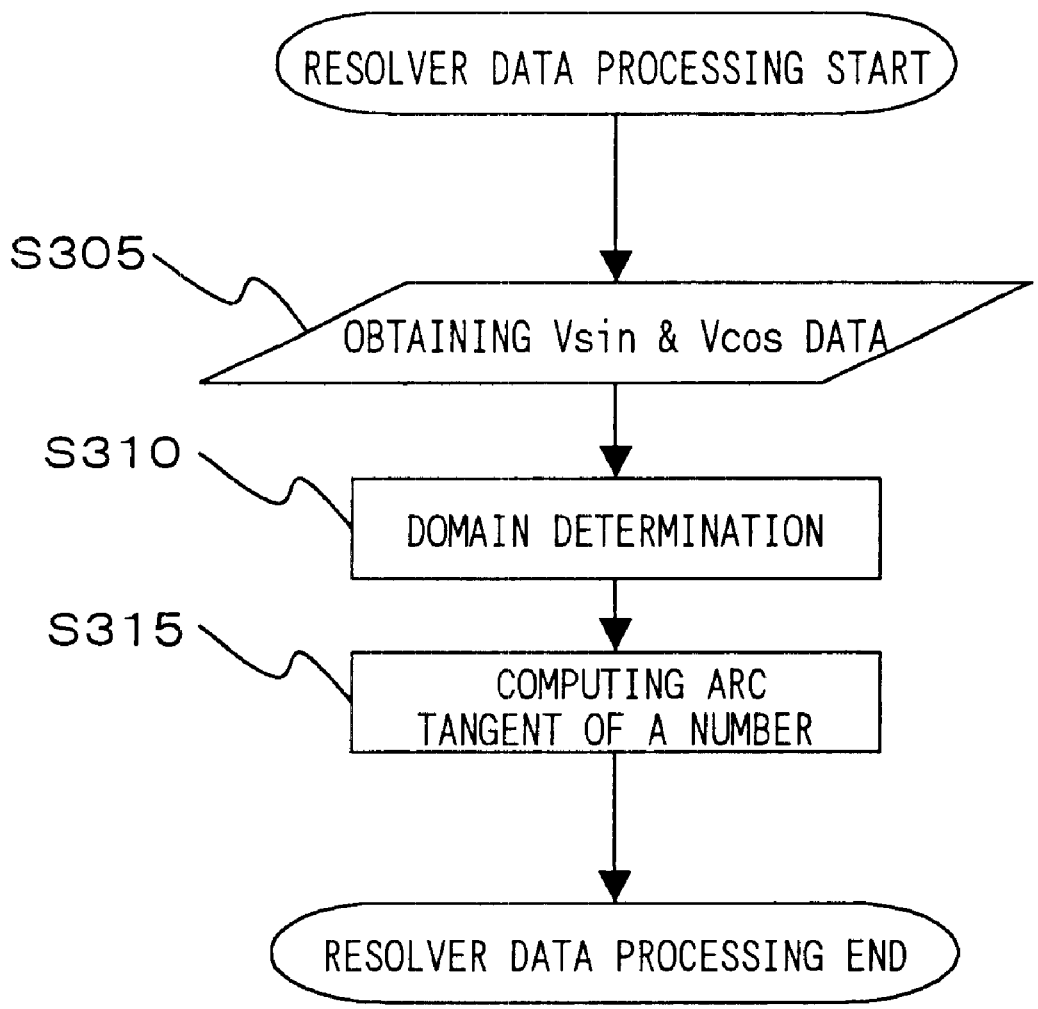
FIG. 11 is a flowchart for outlining the resolver data processing performed by the system of Embodiment 2.

FIG. 11 is a flowchart outlining the resolver data processing S300. First, the system executes the process corresponding to the step 55 of Embodiment 1 and obtains the values of $V_{sin}$ and $V_{cos}$ by sampling resolver output signals (S305). The obtained $V_{sin}$ and $V_{cos}$ values fundamentally correspond to the voltages at resolver output signal amplitude peak points and handled as sin θ and cos θ. The region determination process S310 determines a quadrant in which θ is positioned, based on the positive and negative signs of sin θ and cos θ and determines a region sectionalized in units of 45 degrees in which θ is positioned by comparing the absolute values of sin θ and cos θ and judging which is larger.

The step of computing the arc tangent of a number S315 calculates a value of $\tan^{-1} θ$, based on the values of sin θ and cos θ, which eventually determines an angle of rotor rotation θ within the region determined by the process S310.

The thus determined angle of rotor rotation θ without using the R/D converter is used for the servo control processing for the motor in the offered system.

With regard to FIG. 10, the presented process flow is an example case in which the resolver data processing S300 precedes the step S60 and the main servo control processing starts with the step S60. An alternative process follow can be defined in which the process S300 follows the step S90.

[Embodiment 3]

Figure 12:
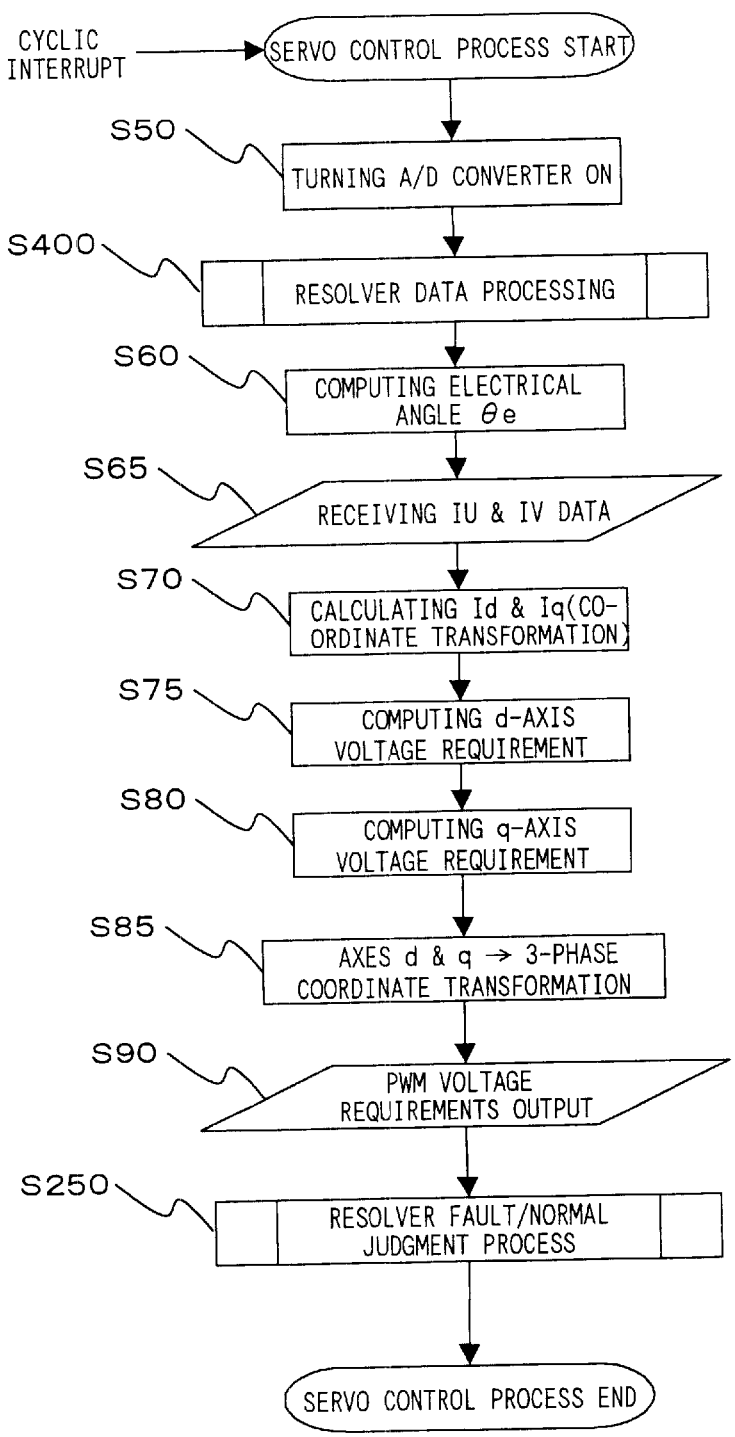
FIG. 12 is a flowchart for outlining the servo control processing performed by the servo control system of the invention in a preferred Embodiment 3.

FIG. 12 is a flowchart outlining the servo control processing performed by a servo control system according to a preferred Embodiment 3. The difference between the servo control processing by the system in Embodiment 3 and the same processing by the system in embodiment 2 is the detail of the resolver data processing. Other processes correspond to those of Embodiment 2 and their explanation will not be repeated.

Figure 13:
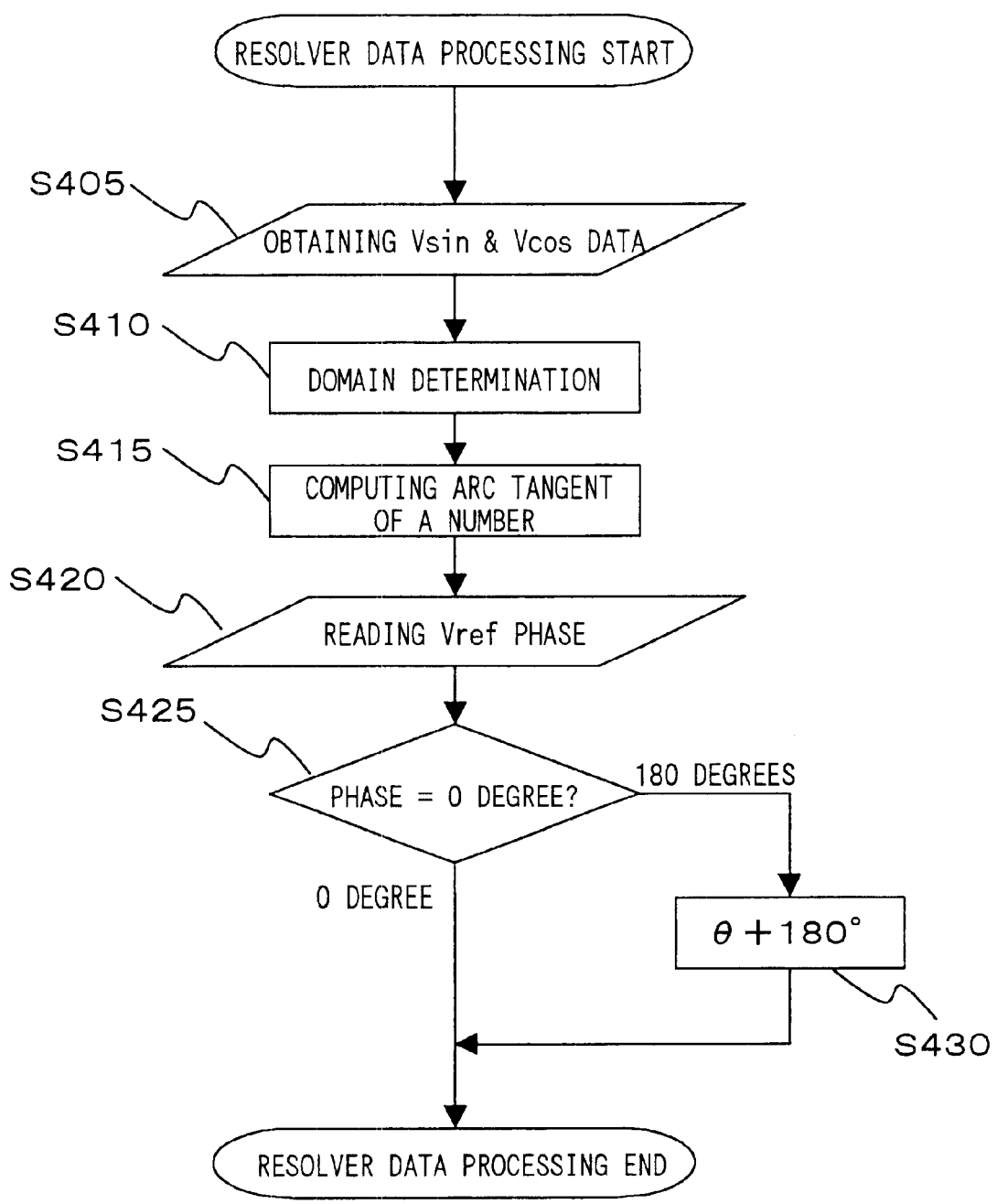
FIG. 13 is a flowchart for outlining the resolver data processing performed by the system of Embodiment 3.

FIG. 13 is a flowchart outlining the resolver data processing performed by the system of Embodiment 3. The process of obtaining the $V_{sin}$ and $V_{cos}$ values by sampling resolver output signals (S405), region determination process S410, and computing the arc tangent of a number S415 are basically the same as the processes S305 to S315 explained above in Embodiment 2. Sampling the resolver output signals (S405) are, however, executed per a half period of the reference signal.

In the case of Embodiment 3, however, the process S420 for obtaining $V_{ref}$ phase information is next executed. As described above, reference signal $V_{ref}$ is generated under the control of the CPU202 in synchronization with the clock, which is true for this embodiment. Therefore, the CPU 202 can reckon the $V_{ref}$ phase, based on the clock pulse count and the $V_{ref}$ phase information is obtained in the process S420. Then, determination is made as to whether the phase is 0 degree or 180 degrees, the former corresponding to the positive amplitude peak of the reference signal, and the latter the negative amplitude peak (S425). The sign of the $V_{sin}$ and $V_{cos}$ values sampled at the negative peak is opposite to the sign of those sampled at the positive peak. For any given angle of rotation θ, the $V_{sin}$ and $V_{cos}$ values are sin θ and cos θ at the positive peak and (−sin θ) and (−cos θ) at the negative peak. Thus, the result of the region determination process S410 for sampled $V_{sin}$ and $V_{cos}$ resolver output signals differs according to whether the peak at which these signals are sampled is positive or negative. For example, the following event occurs: an angle of θ derived from the above signals sampled at the positive peak is determined to be positioned in the first quadrant, while the same angle of θ derived from the signals sampled at the negative peak is determined to be positioned in the third quadrant. As a result, the process of computing the arc tangent of a number S415 assigns different values to the angle θ, opposite to each other by 180 degrees. In the offered system, then, 180 degrees shall be added to the value of θ obtained by computing the arc tangent of a number S415 for the signals sampled at the negative peak, so that any angle of θ derived from the signals sampled at either positive or negative peak can be expressed on the same basis.

This method enables handling a series of values of θ obtained per half period of the reference signal and it is no longer necessary to discriminate between positive and negative peaks at which the signal is sampled. By sampling resolver output signals twice per the cycle period of the reference signal, the offered system can detect the position of angle of rotation θ at a frequency that is double the frequency of the reference signal and shorten the positional data update cycle, or in other words, the servo control loop cycle, without increasing the resolver excitation frequency that is limited to a certain maximum level.

[Embodiment 4]

The structure of the servo control system according to a preferred Embodiment 4 is the same as the embodiments described above and reference signal is similarly generated in synchronization with the clock in the system in Embodiment 4. Thus, it is assured that the resolver output sampling timing is synchronized with the reference signal and servo control loop as in the above embodiments. As an additional feature of Embodiment 4, the offered system can keep the sampling timing better by making a fine adjustment of the phase of reference signal, which will be explained below.

Figure 14:
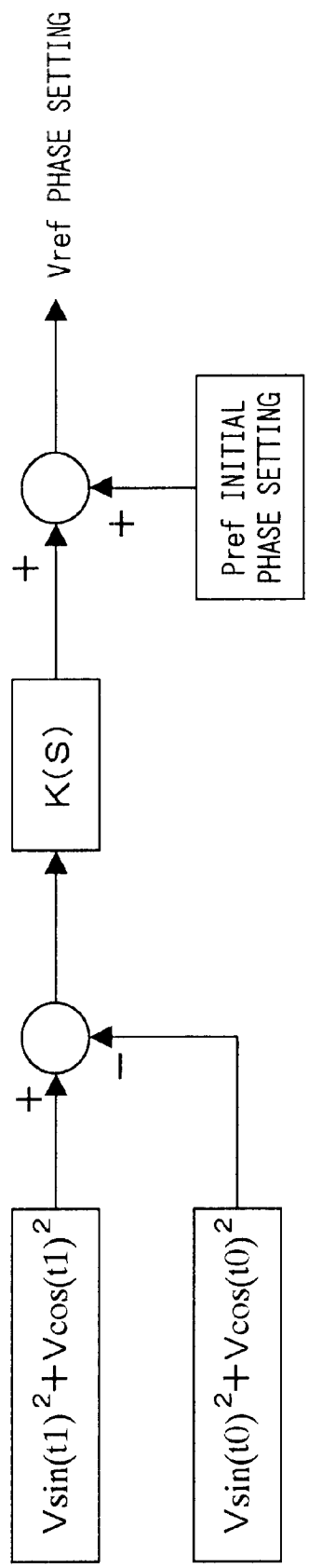
FIG. 14 is a block diagram regarding the reference signal phase control provided by the servo control system of the invention in a preferred Embodiment 4.
Figure 15:
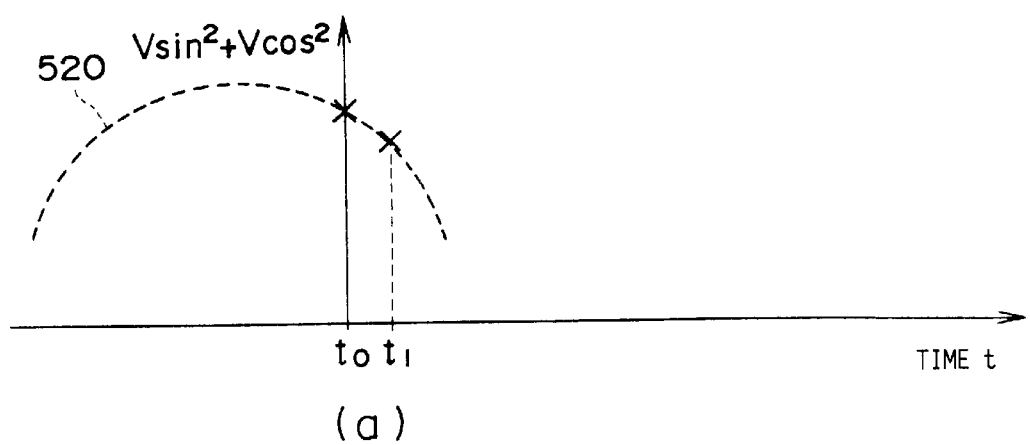
FIG. 15 illustrates one example of typical reference signal phase control provided by the system of the present invention.
Figure 15:
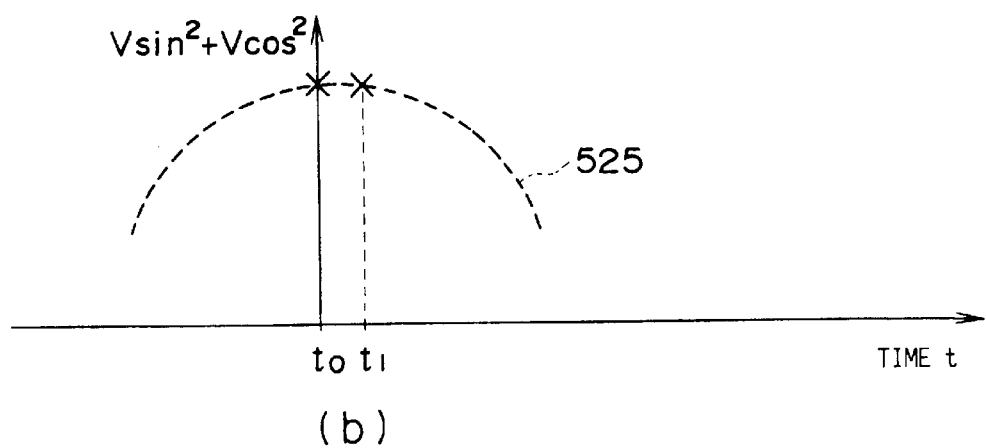

FIG. 14 is a block diagram regarding the reference signal phase control provided by the servo control system of Embodiment 4. FIG. 15 illustrates one example of typical reference signal phase control provided by the offered system. The present system samples a pair of resolver output signals at times t1 and t1 (t0<t1) with a certain interval between them shorter than the cycle period of the reference signal. Based on the comparison between the values derived from these two times of sampling, the system deduces the peak of the resolver output signal amplitude takes place before, between or after these timings of sampling. The system executes this deduction, according to whether the square sum $(V_{sin}^2+V_{cos}^2)$ derived from the $V_{sin}$ and $V_{cos}$ values sampled at t0 is larger or smaller than the corresponding one at t1. This square sum becomes maximum at the peak point of reference signal amplitude. When the result of subtracting the square sum at t0 from the square sum at t1 is a positive value, the peak comes after t0 and t1 or nearer to t1 between t0 and t1. Thus, the phase adjustment is made to advance the phase of the reference signal. Adjustment to advance the phase is defined as positive phase adjustment. Transfer function K(s) shown in FIG. 14 determines the extent of phase adjustment, that is, the difference between the square sums at t0 and t1 is multiplied by a positive factor κ. By adding the extent of phase adjustment thus determined to the initial phase setting Pref, phase adjustment is accomplished.

The horizontal axis shown in FIG. 15 represents time and values of square sum, which change with time, are plotted along the vertical axis. In FIG. 15, (a) shows the state before phase adjustment and (b) shows the state after phase adjustment, and dotted curves 520 and 525 respectively represent the resolver output signal waveforms before and after the phase adjustment. The curve shown in (a), an example waveform before phase adjustment, indicates that sampling times t0 and t1 are in advance of the reference signal peak and the square sum at t0 is larger than that at t1. Under this state, the CPU 202 calculates the extent of negative phase adjustment that delays the phase of reference signal relative to these sampling timings. This phase adjustment is repeated until the square sums at t0 and t1 match with certain precision. During this repetition, a proportional factors used for calculating the extent of phase adjustment may be constant. Alternatively, the factors may be set at a larger value initially and trimmed to a smaller value when one sampling timing is judged to be having passed the peak point (this is detected by the inversion of the sign of the difference between the square sums). This may improve both adjustment accuracy and convergence speed. FIG. 15(b) indicates the waveform in the phase adjustment completed status.

This phase adjustment may be performed either at all times when the system is operating at every sampling or at regular intervals. The system of Embodiment 4 can absorb fluctuation that may be caused by the change of environment including temperature and humidity, thus more precisely detecting the angle of rotation.

[Embodiment 5]

The structure of the servo control system according to a preferred Embodiment 5 is the same as other embodiments of the invention described above and reference signal is similarly generated in synchronization with the clock in the system in Embodiment 5. As in the above embodiments, the system assures that the resolver output sampling timing is synchronized with the reference signal and servo control loop. As a noticeable feature of embodiment 5, the system can keep the sampling timing even better by making a fine adjustment of the phase of reference signal, as will be explained below.

Figure 16:
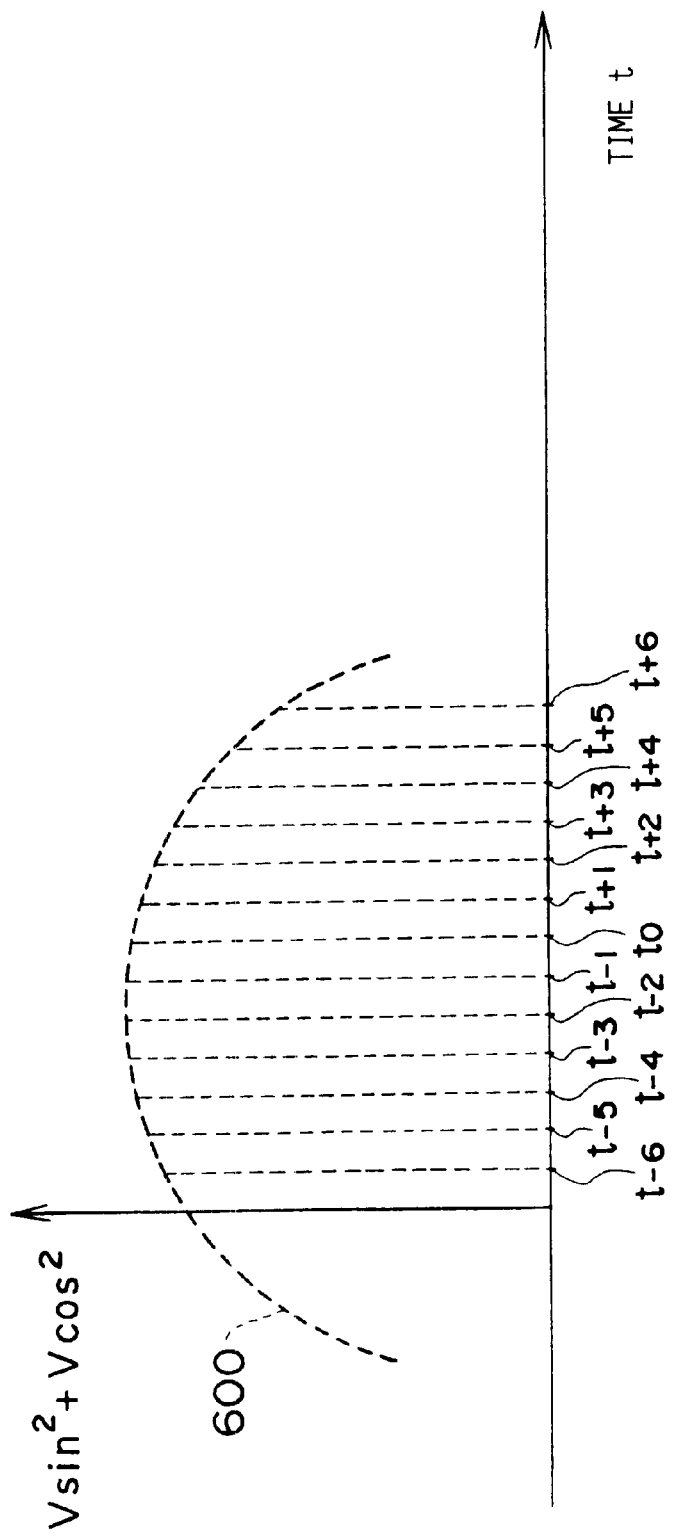
FIG. 16 illustrates one example of typical reference signal phase control provided by the servo control system offered by the invention of a preferred Embodiment 5.

FIG. 16 illustrates one example of typical reference signal phase control provided by the servo control system offered by the invention in preferred embodiment 5. A horizontal axis shown in FIG. 16 represents time and values of square sum are plotted along the horizontal axis. A dotted curve 600 represents the reference signal waveform. The offered system samples resolver output signals at several times in a certain range before and after the basis timing t0 of sampling and detects the maximum point at which the square sum derived from the sampled signals become maximum. Then, the system executes phase adjustment to shift this maximum point toward the basis point of sampling t0.

FIG. 16 shows an example case in which sampling points $t_{-6}$ to $t_{+6}$ are set at every 5 degrees in the ±30 degrees of phase range around the basis point of sampling t0. This phase range is set in accordance with the anticipated degree of phase shift of reference signal and the sampling point spacing is based on the required phase adjustment accuracy.

The square sum ($V_{sin}^2 + V_{cos}^2$) of sampled signal voltages is calculated for each sampling point and a point with the maximum square sum is detected. In this example, the square sum becomes maximum at $t_{-2}$, indicating that the reference signal amplitude reaches the peak at $t_{-2}$. Then, the phase of reference signal is adjusted to 10 degrees behind so that the peak will shift toward the basis point of sampling t0. As a result, the dotted curve 600 in FIG. 16, corresponding to the reference signal, is shifting to the right just by two points of sampling and its peak eventually matches the t0 point.

For example, this phase adjustment control is set to cycle several tens of times immediately after the system operation starts and off during the normal mode of operation. The time variation may be caused by phase delay of two signals of $V_{sin}$ and $V_{cos}$ phases which are returned from the reference signal. This event is due to the variation of the characteristics of the resolver 200 itself and the band-pass filter 222, for example. With the phase control discussed above, however, the offered system in embodiment 5 is able to absorb such time variation and achieve exact detection of angle of rotation.

[Embodiment 6]

The structure of the servo control system according to a preferred Embodiment 6 is basically the same as the embodiments described above and reference signal is similarly generated in synchronization with the clock in the system of Embodiment 6. Like the system explained in the above embodiments, this system also assures that the resolver output sampling timing is synchronized with the reference signal and servo control loop. A noticeable feature of embodiment 6 is achieving efficient detection of angle of rotation θ, as explained below.

The servo control system includes a table of angles of rotation that contains possible values of tan θ associated with angles of θ. The system obtains an angle of rotation θ by searching this table, based on the sampled $V_{sin}$ and $V_{cos}$ resolver output signals.

Figure 17:
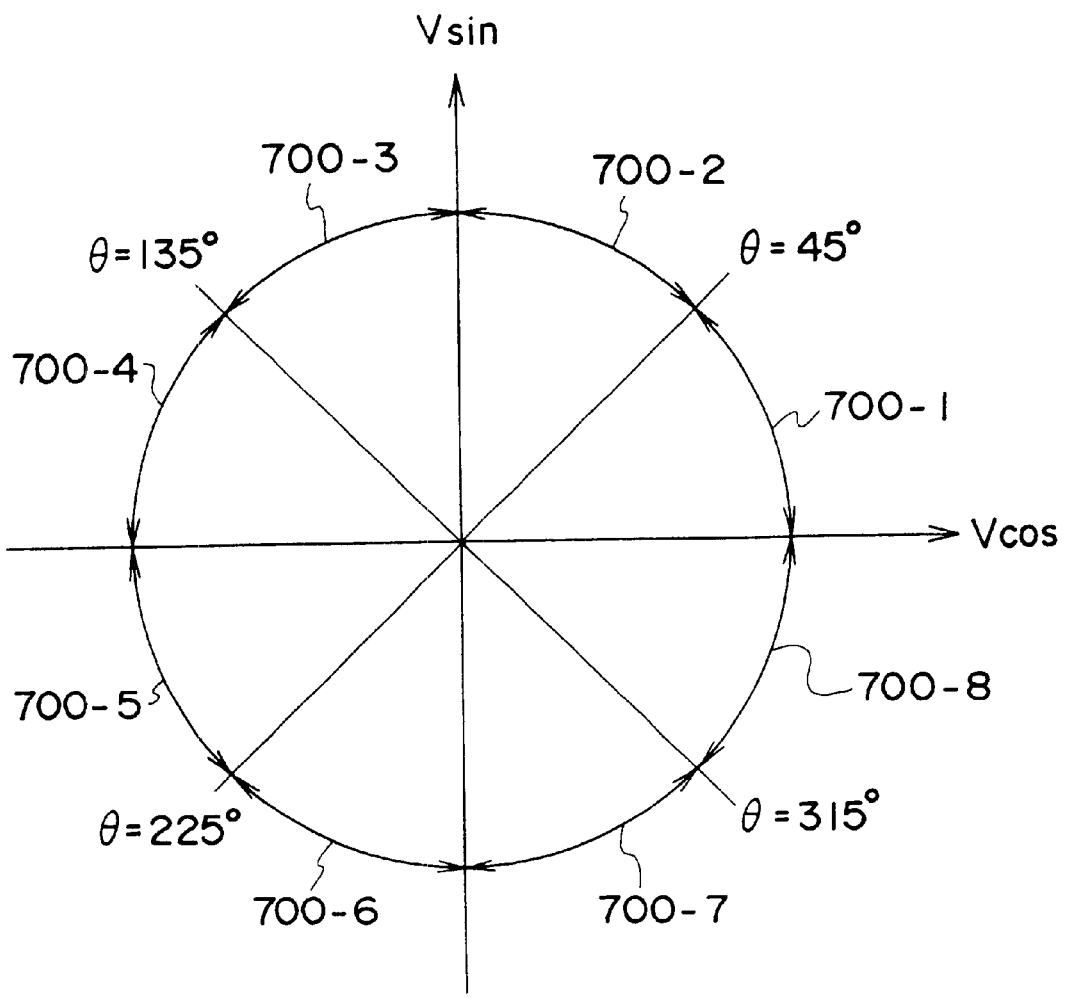
FIG. 17 illustrates the evenly sectionalized domains of one rotation for obtaining angle of rotation θ with regard to a preferred Embodiment 6 of the present invention.

By sectionalizing one turn of rotation into eight domains 700-1 to 700-8 as shown in FIG. 17, the cyclic and symmetrical nature of values of tan θ appear within one rotation. The above-mentioned table of angles of rotation is a one-dimensional table that solely contains the angles within 0°≦θ≦45° in the domain 700-1 of the above domains with each angle corresponding to a value of tangent function. Furthermore, by dividing one turn of rotation (2π) into 4096 steps, any angle of rotation to be detected by the offered system is assigned index n that corresponds to each step in one rotation. The relationship between index n and angle of rotation θ is expressed as follows:

$$\theta = n \times 2\pi / 4096$$

Indexes n=0 to 511 are assigned to the angles within the above domain 700-1 and the table includes the angles arrayed with an argument of index n. Element DT(n), shown below, corresponding to the n-th angle is stored into the table:

$$DT(n) = \tan(n \times 2\pi / 4096)$$

Other domains are indexed as follows: domain 700-2 corresponds to indexes 512 through 1023, domain 700-3 to indexes 1024 through 1535, domain 700-4 to indexes 1536 through 2047, domain 700-5 to indexes 2048 through 2559, domain 700-6 to indexes 2560 through 3071, domain 700-7 to indexes 3072 through 3583, and domain 700-8 to indexes 3584 through 4095.

Figure 18:
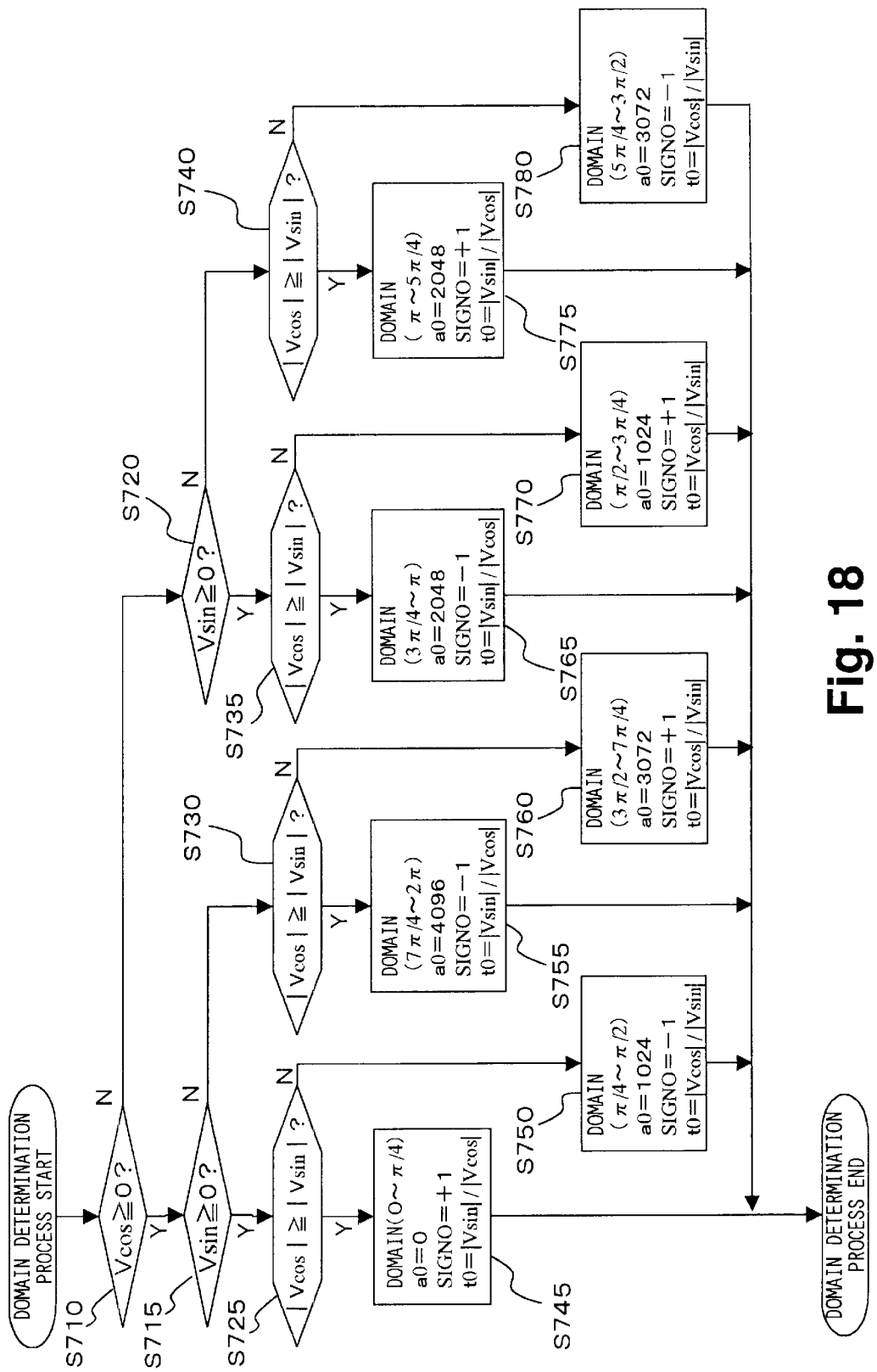
FIG. 18 is a flowchart outlining an example of the domain determination process with regard to Embodiment 6.

FIG. 18 is a flowchart outlining the domain determination process that determines one of the above domains within which a value of θ falls by evaluating the sampled $V_{sin}$ and $V_{cos}$ resolver output signals. In this process, step 720 determines whether $V_{cos}$ is larger than 0 and steps S715 and S720 determine whether $V_{sin}$ is larger than 0. According to the result of these steps, one of the four quadrants is decided. Furthermore, steps S725, S730, S735 and S740 determine whether an absolute value of $V_{cos}$ is larger than that of $V_{sin}$. Based on these steps, one of the eight domains is decided, that is, one of the two 45-degree sectors of each quadrant, within which a value of θ falls.

Parameters a0, SIGN0, and t0 are retained for each domain (S745 through S780). These parameters are required for the eight domains to share the above-mentioned table that is defined only for the range of 0°≦θ≦45° corresponding to the domain 700-1. Parameter t0 is an absolute value of either tangent or cotangent function, calculated from the sampled signals. The table contains possible values from 0 to 1 of tangent function corresponding to the angles that fall within the domain 700-1. For domains in which an absolute value of tangent function is more than 1 and up to ∞, an absolute value of cotangent function which is the reciprocal number of tangent is calculated instead of tangent. In this way, all domains can share the table. By the way, the division algorithm used for calculating a value of tangent or cotangent, based on the sampled signals is defined as 0/0=0 for convenience.

Parameters a0 and SIGNO provide the information for how discrete angles (with index n') in the remaining domains are associated with the 512 discrete angles (with index n) in the domain 700-1 for which the table is prepared. The a0 parameter is an index at which the value of tangent or cotangent within the domain becomes 0 and either the minimum or the maximum index assigned to the domain. If the minimum index is selected as a0, the SIGNO parameter is "+1." If the maximum index is selected as a0, the SIGNO parameter is "−1." Specifically, because of the cyclic and symmetrical nature of tangent function, in the case of odd-numbered domains, namely, 700-1, 700-3, 700-5, and 700-7, a0 is the minimum index assigned to the domain with SIGNO=+1. In the case of even-numbered domains, namely, 700-2, 700-4, 700-6, and 700-8, a0 is the maximum index assigned to the domain with SIGNO=−1. With the a0 and SIGNO parameters, the correspondence between index n' and index n is expressed in the following equation:

$$n' = a0 + \text{SIGNO} \times n \quad (1)$$

Figure 19:
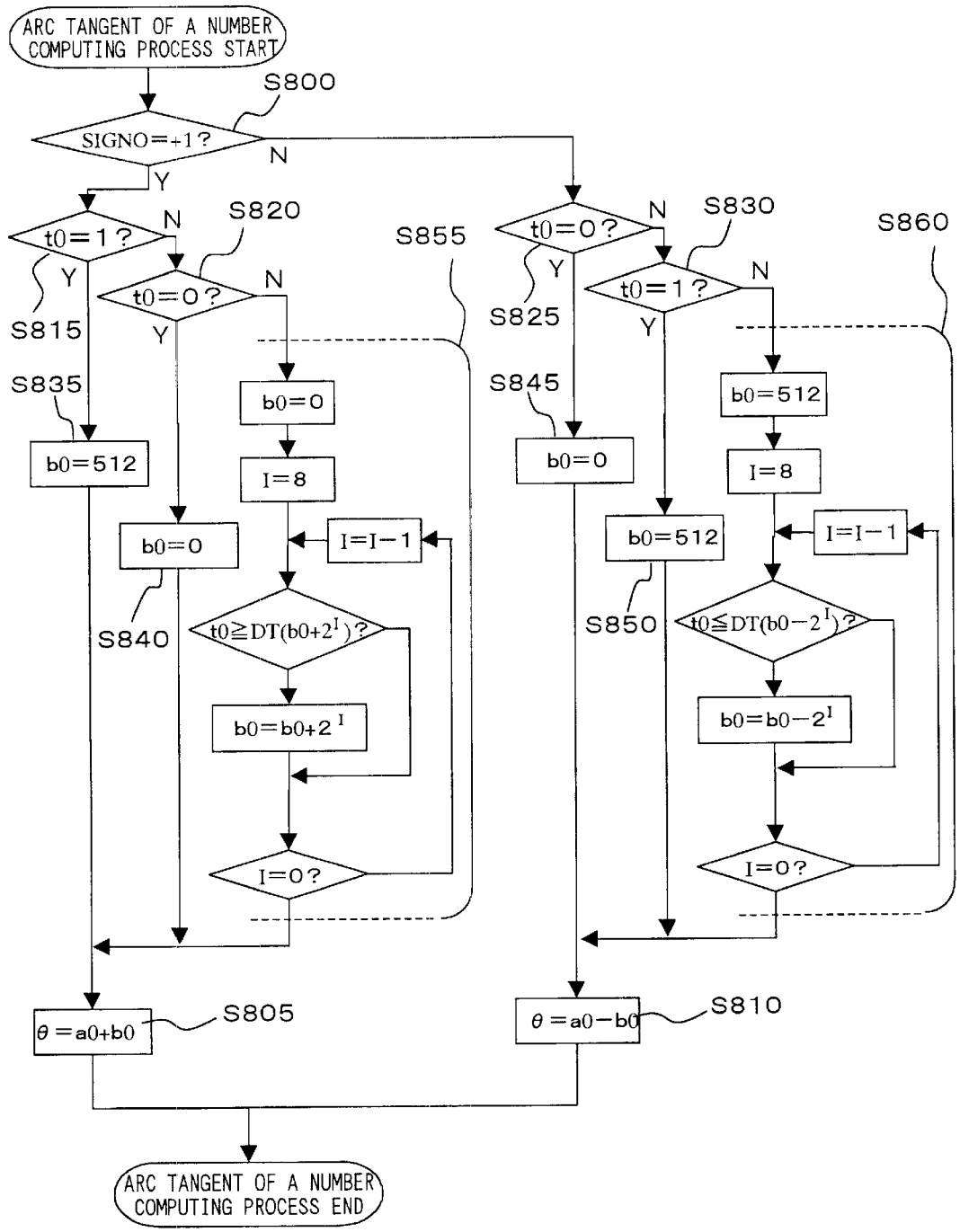
FIG. 19 is a flowchart outlining an example of the process of computing the arc tangent of a number with regard to Embodiment 6.

FIG. 19 is a flowchart outlining the process of computing the arc tangent of a number to fix an angle of rotation θ from a value of tangent function stored in the table of angles of rotation. This process is essentially carried out by the offered system as follows. The system searches the table to find DT (n) that matches the t0 value of tangent or cotangent calculated from the sampled signals. Then, the system converts the index n corresponding to the DT (n) in the domain 700-1 into index n' in the appropriate domain as required.

As concerns steps S805 and S810 in FIG. 19, S805 is the calculation of equation (1) when SIGNO is "+1" and S810 is the calculation of equation (1) when SIGNO is "−1." θ and b0 in this FIG corresponds to n' and n in equation (1), respectively. When t0=1 or 0 (S815, S820, S825, and S830), b0 can be fixed at 512 or 0 without any calculation (S835, S840, S845, and S850). If to is a value more than 0 and less than 1, b0 is determined by using the bisection algorithm, that is, the target domain including two to the 9th power, 512 indexes is divided into two parts, each of which is in turn divided into two parts, and such division is repeated until DT (n) is searched out (S855 and S860). A value of θ is calculated, based on the thus determined value of b0 (S805 and S810).

Figure 20:
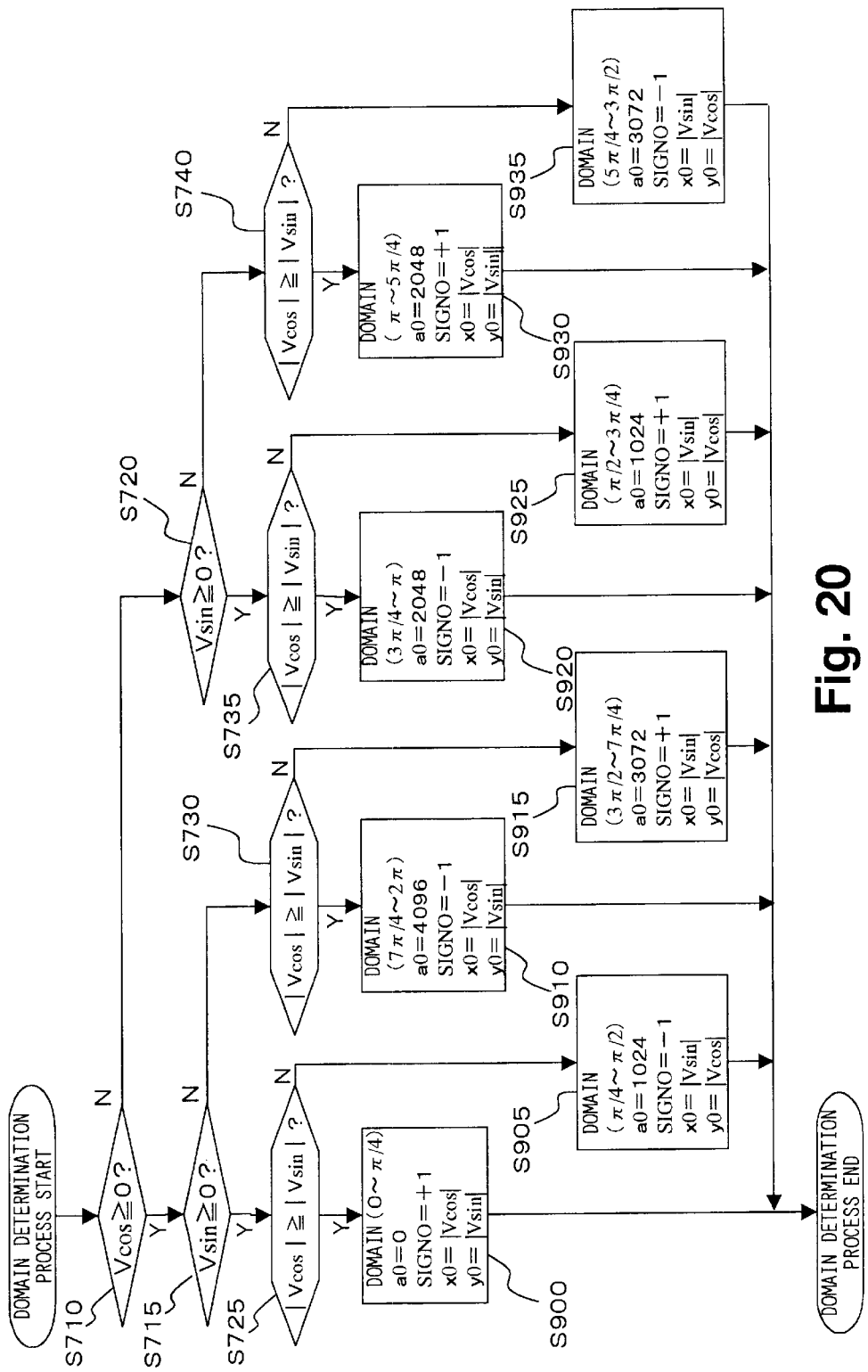
FIG. 20 is a flowchart outlining another example of the domain determination process.
Figure 21:
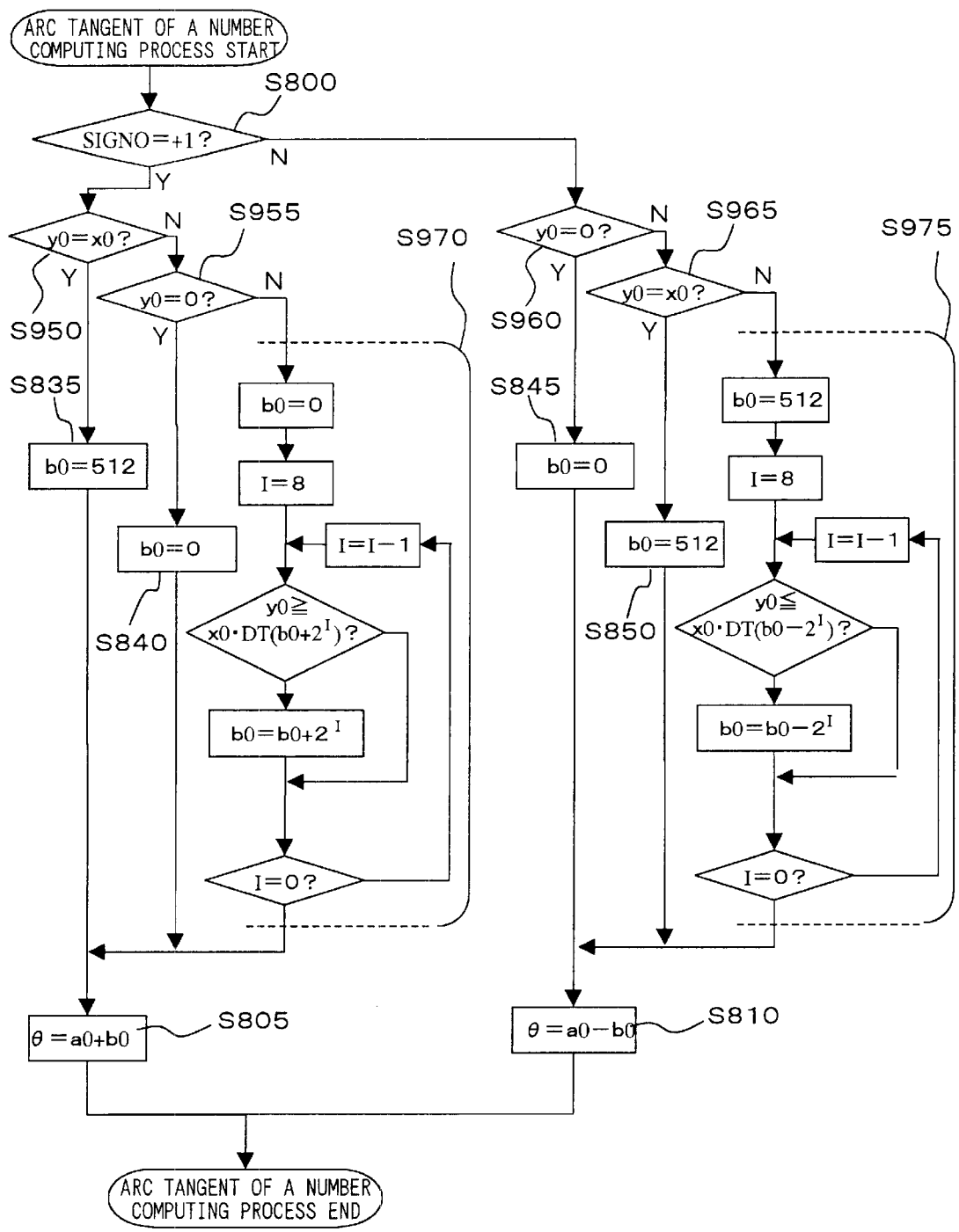
FIG. 21 is a flowchart outlining another example of the process of computing the arc tangent of a number.

FIGS. 20 and 21 are flowcharts with regard to the modified processes for domain determination and computing the arc tangent of a number, respectively. These processes differ from those explained with reference to FIGS. 18 and 19 in that the calculation of t0, a value of tangent or cotangent, from the sampled signals is not necessary. In the modified domain determination process, after the steps for determining a domain, parameters x0 and y0 corresponding to the absolute values of sampled $V_{sin}$ and $V_{cos}$ are retained for each domain (S900 through S935) instead of the calculation of t0. As concerns the process computing the arc tangent of a number, the determination is made as to whether y0=x0 (S950 and S965, FIG. 21) instead of the determination as to whether t0=1 (S815 and S830, FIG. 19). Also, the determination is made as to whether y0=0 (S955 and S960, FIG. 21) instead of the determination as to whether t0=0 (S820 and 5825, FIG. 19). The processing steps that correspond to S855 and S860 are S970 and S975 in which the bisection algorithm using x0 and y0 determines b0. The procedures outlined by FIGS. 20 and 21, in which the calculation of tangent or cotangent is eliminated, avoid the division, which puts heavy load on the CPU, and contribute to the increase of processing speed and efficiency.

Determination of an angle of rotation θ based on sampled signals is achieved in the present invention by simply searching the table of angles of rotation, without the need of directly computing the arc tangent of a number, $\tan^{-2}$ ($V_{sin}/V_{cos}$). Thus, the load on the CPU is decreased and the computation time is shortened. By utilizing the cyclic and symmetrical nature of tangent function, one turn of rotation is divided into eight domains and the table holds possible values of tangent function for only one domain, while being shared with the remaining domains. In this way, the table size can be decreased.

[Embodiment 7]

The structure of the servo control system of a preferred Embodiment 7 is basically the same as other embodiments described above and reference signal is similarly generated in synchronization with the clock in the system in Embodiment 7. As explained in the above embodiments, this system also assures that the resolver output sampling timing is synchronized with the reference signal and servo control loop. A noticeable feature of Embodiment 7 is achieving efficient detection of angle of rotation θ, as explained below.

The servo control system includes a table of angles of rotation for associating angles of rotation θ with possible sets of a value of sine θ and a value of cosine θ. The system obtains an angle of rotation θ by searching this table, based on the sampled $V_{sin}$ and $V_{cos}$ resolver output signals.

Figure 22:
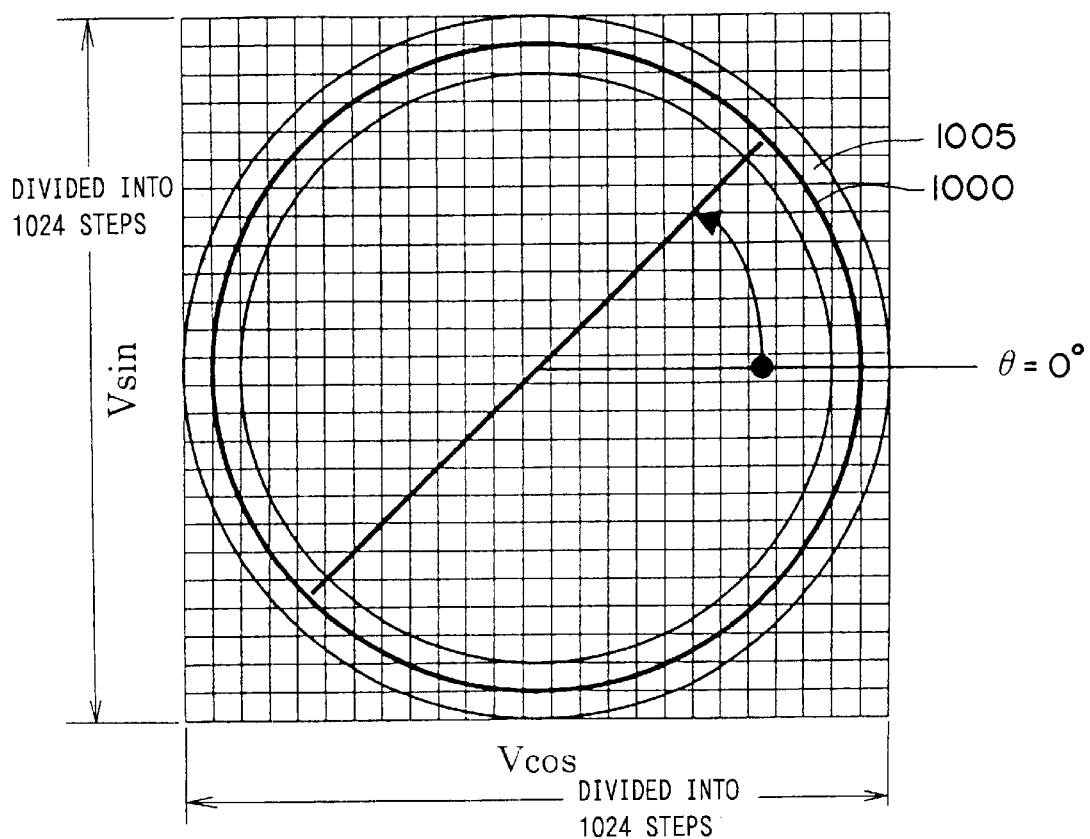
FIG. 22 illustrates a table of angles of rotation with regard to a preferred Embodiment 7 of the present invention.

FIG. 22 illustrates the table of angles of rotation used in the system in Embodiment 7. This table is a two-dimensional table with independent two arguments. One argument is a value of $V_{sin}$ and the other is a value of $V_{cos}$. Each value assignment range for $V_{sin}$ and $V_{cos}$ including possible values from −1 to 1 is divided into 1024 steps, for example. These steps are sequentially indexed from 0 to 1023. A pair of a $V_{sin}$ value index and a $V_{cos}$ value index specifies an address on the memory at which a value of θ derived by the prior computation of $\tan^{-1}$ ($V_{sin}/V_{cos}$), the arc tangent of a number, has been stored.

Furthermore, an error bit can be added to the stored θ data. Under normal operation status, the condition that the square sum of $V_{sin}$ and $V_{cos}$ equals E2 is fulfilled as the relation between them. In FIG. 22, a circular locus 1000 represents this relation between $V_{sin}$ and $V_{cos}$. In this table used by the offered system, there is a ring zone with a given width 1005 around the circular locus 1000. This ring zone is the range of possible values of $V_{sin}$ and $V_{cos}$ under normal operation condition and the error bit is set to 0 as long as $V_{sin}$ and $V_{cos}$ values fall within this zone. If these values fall outside the ring zone 1005, either outer or inner, the error bit is set to 1, indicating abnormal condition. By reading the data stored at address specified by a $V_{sin}$ and $V_{cos}$ index pair, the offered system can immediately determine a value of θ without computation, and also judge whether it is abnormal, according to the error bit content.

The data to be stored at each address of the table is not limited to the data obtained by simply computing $\tan^{-1}$ ($V_{sin}/V_{cos}$) Other data can be stored, for example, a value of θ with the resolver angle accuracy compensated, so that an accurate angle of rotation θ can be obtained immediately without compensation that should otherwise be carried out successively.

What is claimed is:

1. A resolver signal processing system that supplies a reference signal to a resolver and processes output signals from said resolver which are produced by modulating the amplitude of said reference signal, dependent on the angle of rotation of a rotator, comprising:

reference signal generating means for generating said reference signal that cycles in a given period on the basis of a clock;

sampling trigger signal generating means to generate a sampling trigger signal, which cycles in a given period on the basis of the period of said reference signal, in synchronization with said clock;

detection means to sample said output signals from said resolver in response to said sampling trigger signal and detect sine and cosine modulated signals in accordance with said angle of rotation from said output signals; and angle of rotation determining means to determine said angle of rotation, based on said sine and cosine modulated signals.

2. The resolver signal processing system according to claim 1, further comprising:

rotator control trigger signal generating means for generating a rotator control trigger signal in synchronization with said sampling trigger signal, based on said clock; and rotator control means to start the control of said rotator in response to said rotator control trigger signal.

3. The resolver signal processing system according to claim 1, wherein said sampling trigger signal generating means will generate said sampling trigger signal at timings that discretely correspond to two amplitude peaks of said reference signal, positive and negative during one cycle period.

4. The resolver signal processing system according to claim 1, wherein said sampling trigger signal generating means will:

continuously generate a plurality of said sampling trigger signals over a given peak seeking period;

detect the peak points of said reference signal, based on the values of said resolver output signals sampled in response to said continuously generated sampling trigger signals; and determine the timings of generating said sampling trigger signals after said peak seeking period, based on said reference signal peak points thus detected as above.

5. The resolver signal processing system according to claim 1, wherein said sampling trigger signal generating means will:

generate a pair of said sampling trigger signals such that the second one takes place after a fixed interval from the first one occurring;

detect a point of peak amplitude of said reference signal relative to the timings of said pair of sampling trigger signals, based on the values of said resolver output signals sampled in response to said pair of sampling trigger signals; and determine the timings of generating the next pair of sampling trigger signals, based on the relative peak point of the reference signal thus detected as above.

6. The resolver signal processing system according to claim 1, further including said angle of rotation determining means comprising a table of angles of rotation for associating angles of rotation with possible sets of a value of sine function and a value of cosine function; and angle of rotation reading means to obtain said angle of rotation from said table, based on the value derived from said sine and cosine modulated signals.

7. The resolver signal processing system according to claim 1, further including said angle of rotation determining means comprising a table of angles of rotation for associating angles of rotation with possible values of tangent function; and angle of rotation reading means to obtain said angle of rotation from said table, based on the value derived from said sine and cosine modulated signals.

8. The resolver signal processing system according to claim 1, further including fault detection means for detecting a fault in said resolver, based on the comparison between the square sum of said sine and cosine modulated signals and the amplitude of said modulated signals.

9. The resolver signal processing system according to claim 2, wherein said sampling trigger signal generating means will generate said sampling trigger signal at timings that discretely correspond to two amplitude peaks of said reference signal, positive and negative during one cycle period.

10. The resolver signal processing system according to claim 2, wherein said sampling trigger signal generating means will:

continuously generate a plurality of said sampling trigger signals over a given peak seeking period;

detect the peak points of said reference signal, based on the values of said resolver output signals sampled in response to said continuously generated sampling trigger signals; and determine the timings of generating said sampling trigger signals after said peak seeking period, based on said reference signal peak points thus detected as above.

11. The resolver signal processing system according to claim 2, wherein said sampling trigger signal generating means will:

generate a pair of said sampling trigger signals such that the second one takes place after a fixed interval from the first one occurring;

detect a point of peak amplitude of said reference signal relative to the timings of said pair of sampling trigger signals, based on the values of said resolver output signals sampled in response to said pair of sampling trigger signals; and determine the timings of generating the next pair of sampling trigger signals, based on the relative peak point of the reference signal thus detected as above.

12. The resolver signal processing system according to claim 2, further including said angle of rotation determining means comprising a table of angles of rotation for associating angles of rotation with possible sets of a value of sine function and a value of cosine function; and angle of rotation reading means to obtain said angle of rotation from said table, based on the value derived from said sine and cosine modulated signals.

13. The resolver signal processing system according to claim 2, further including said angle of rotation determining means comprising a table of angles of rotation for associating angles of rotation with possible values of tangent function; and angle of rotation reading means to obtain said angle of rotation from said table, based on the value derived from said sine and cosine modulated signals.

14. The resolver signal processing system according to claim 2, further including fault detection means for detecting a fault in said resolver, based on the comparison between the square sum of said sine and cosine modulated signals and the amplitude of said modulated signals.

15. The resolver signal processing system according to claim 1, the reference signal generating means comprising:

a counter that counts a clock signal of the clock; and a filter that generates the reference signal by filtering a signal generated based on an output of the counter.

16. The resolver signal processing system according to claim 15, wherein the counter outputs sequential count values having a count limit setting the period of the reference signal.

17. The resolver signal processing system according to claim 16, wherein said reference signal generating means further comprises a memory, contents of the memory being output sequentially based on the count values.

18. The resolver signal processing system according to claim 17 further comprising a converter to convert the contents of the memory output into an analog waveform as the signal being filtered.

19. The resolver signal processing system according to claims 15 further comprising an adder to output sequential addresses and capable of adding a phase parameter value with a sequential count value which phase shifts the reference signal.

20. An apparatus that determines an angle of rotation of a rotator, comprising:

a reference signal generator that generates a periodic reference signal for output to a resolver;

a sample trigger signal generator that generates sample trigger signals based on an output of the reference signal generator, the sample trigger signal is synchronous with respect to the periodic reference signal;

a signal sampler, the signal sampler sampling one or more resolver output signals based on the sample trigger signal to obtain magnitudes of the resolver output signals at a specific phase of the resolver output signals; and a processor that generates the angle of rotation of the rotator based on the magnitudes.

* * * * *